(12) United States Patent
Misaki

(10) Patent No.: US 8,698,153 B2
(45) Date of Patent: Apr. 15, 2014

(54) SEMICONDUCTOR DEVICE AND PROCESS FOR PRODUCTION THEREOF

(75) Inventor: Katsunori Misaki, Yonago (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/703,696

(22) PCT Filed: Jun. 21, 2011

(86) PCT No.: PCT/JP2011/064140
§ 371 (c)(1),
(2), (4) Date: Dec. 12, 2012

(87) PCT Pub. No.: WO2011/162242
PCT Pub. Date: Dec. 29, 2011

(65) Prior Publication Data
US 2013/0087798 A1     Apr. 11, 2013

(30) Foreign Application Priority Data

Jun. 24, 2010   (JP) .................................. 2010-144049

(51) Int. Cl.
*H01L 33/00*     (2010.01)
(52) U.S. Cl.
USPC ............................................. 257/59; 438/34
(58) Field of Classification Search
USPC ............................................. 257/43; 438/30
See application file for complete search history.

(56) References Cited

U.S. PATENT DOCUMENTS

| 5,825,449 A | * | 10/1998 | Shin | .............................. | 349/148 |
| 6,338,989 B1 | * | 1/2002 | Ahn et al. | ..................... | 438/158 |
| 2010/0072470 A1 | * | 3/2010 | Yamazaki et al. | ............. | 257/43 |

FOREIGN PATENT DOCUMENTS

| JP | 2003-298062 A | 10/2003 |
| JP | 2004-061687 A | 2/2004 |
| JP | 2008-170664 A | 7/2008 |

OTHER PUBLICATIONS

Official Communication issued in International Patent Application No. PCT/JP2011/064140, mailed on Jul. 19, 2011.
English translation of Official Communication issued in corresponding International Application PCT/JP2011/064140, mailed on Jan. 24, 2013.

* cited by examiner

*Primary Examiner* — David Vu
*Assistant Examiner* — Jonathan Han
(74) *Attorney, Agent, or Firm* — Keating & Bennett, LLP

(57) ABSTRACT

The TFT substrate (100A) in the present invention includes a thin film transistor, a gate line (3a), a source line (13as), and first and second terminals (40a, 40b) for electrically connecting the thin film transistor to an external wiring which are formed on a substrate (1). The first terminal includes a first gate terminal portion (41a) and a first pixel electrode line (29a). The first pixel electrode line is in contact with the first gate terminal portion in a first opening portion (27c) provided in an insulating film (5), and covers an end face of the insulating film in the first opening portion. The second terminal includes a second gate terminal portion (41b) and a second pixel electrode line (29b). The second pixel electrode line is in contact with the second gate terminal portion in a second opening portion (27d) provided in the insulating film, and covers an end face of the insulating film in the second opening portion.

19 Claims, 15 Drawing Sheets

(a)

(b)

(c)

(a)

(b)

(c)

(d)

(e)

(a)

(b)

(c)

(d)

(a)

(b)

(a)

(b)

(a)

(b)

(c)

(d)

(a)

(b)

(a)

(b)

(a)

(b)

SEMICONDUCTOR DEVICE AND PROCESS FOR PRODUCTION THEREOF

TECHNICAL FIELD

The present invention relates to a semiconductor device provided with a thin film transistor, and a production method thereof.

BACKGROUND ART

An active matrix liquid crystal display device generally includes a substrate on which a thin film transistor (hereinafter abbreviated as a TFT) is formed as a switching element for each pixel (hereinafter referred to as a TFT substrate), a counter substrate on which a counter electrode, a color filter, and the like are formed, and a liquid crystal layer disposed between the TFT substrate and the counter substrate. The TFT substrate is also used in another type of active matrix display device such as an organic EL display device.

For example, on a TFT substrate of a liquid crystal display device, a plurality of source lines, a plurality of gate lines, a plurality of TFTs respectively arranged in crossing portions of the lines, pixel electrodes, storage capacitor lines, storage capacitor electrodes, and the like are formed. In an end portion of the TFT substrate, terminals for respectively connecting the source lines and the gate lines to input terminals of a driving circuit are provided.

The configuration of the TFT substrate is disclosed in Patent Document No. 1, for example. Hereinafter, with reference to the drawings, the configuration of the TFT substrate of a liquid crystal display device disclosed in Patent Document No. 1 will be exemplarily described.

FIG. 17(a) is a schematic plan view generally showing the TFT substrate, and FIG. 17(b) is an enlarged plan view showing one pixel in the TFT substrate. FIG. 18 is a sectional view of a TFT and a terminal on the TFT substrate shown in FIG. 17.

As shown in FIG. 17(a), the TFT substrate includes a plurality of gate lines 2016 and a plurality of source lines 2017. Each region 2021 surrounded by these lines 2016 and 2017 functions as "a pixel". In an area 2040 of the TFT substrate positioned in an outer edge portion of an area in which the pixels are formed (a display area), a plurality of connecting portion 2041 for connecting the plurality of gate lines 2016 and the plurality of source lines 2017 to the driving circuit, respectively, are arranged. Respective connecting portions 2041 constitute a terminal for the connection to an external wiring. In this specification, the area of the TFT substrate in which the plurality of terminals are arranged is referred to as "a terminal area".

As shown in FIG. 17(b) and FIG. 18, a pixel electrode 2020 is provided in each region 2021 functioning as a pixel. In addition, in each region 2021, a TFT is formed. The TFT has a gate electrode G, gate insulating films 2025 and 2026 which cover the gate electrode G, a semiconductor layer 2019 disposed on the gate insulating film 2026, and a source electrode S and a drain electrode D connected to respective end portions of the semiconductor layer 2019. The TFT is covered with a passivation film 2028. Between the passivation film 2028 and the pixel electrode 2020, an interlayer insulating film 2029 is formed. The source electrode S of the TFT is connected to the source line 2017, and the gate electrode G is connected to the gate line 2016. The drain electrode D is connected to the pixel electrode 2020 in a contact hole 2030.

A storage capacitor line 2018 is formed in parallel to the gate line 2016. The storage capacitor line 2018 is connected to a storage capacitor. Herein, the storage capacitor is constituted by a storage capacitor electrode 2018b which is formed by the same conductive film as that of the drain electrode, a storage capacitor electrode 2018a formed by the same conductive film as that of the gate line, and a gate insulating film 2026 positioned therebetween.

For example, on the connecting portion 2041 extending from the gate line 2016, the gate insulating films 2025 and 2026 and the passivation film 2028 are not formed. A connecting line 2044 is formed so as to be in contact with the upper surface of the connecting portion 2041. Accordingly, electrical connection between the connecting portion 2041 and the connecting line 2044 is ensured.

As shown in FIG. 18, the TFT substrate of the liquid crystal display device is arranged so as to be opposed to a substrate 2014 on which a counter electrode and a color filter are formed with a liquid crystal layer 2015 interposed therebetween.

When such a TFT substrate is to be produced, it is preferred that a region 2021 which functions as a pixel (also referred to as "a pixel portion") and a terminal may be formed by a common process, thereby suppressing the increase in number of masks and process steps.

In order to form a terminal portion of the TFT substrate shown in FIG. 18, after removing the gate insulating films (the gate insulating film may sometimes have a single-layer structure) 2025 and 2026 which cover the connecting portion 2041 formed by the same conductive layer as that of the gate electrode, and the passivation film 2028, it is necessary to form a connecting line 2044 by the same transparent conductive layer as that of the pixel electrode. Patent Document No. 2 discloses a method in which an interlayer insulating film 2029 is utilized as an etching mask in the etching for removing the gate insulating films (the gate insulating film may sometimes have a single-layer structure) 2025 and 2026 and the passivation film 2028.

On the other hand, in recent years, it is suggested that an active layer of the TFT be formed by using an oxide semiconductor film such as zinc oxide, instead of the silicon semiconductor film. Such a TFT is referred to as "an oxide semiconductor TFT". The oxide semiconductor has higher mobility than amorphous silicon. For this reason, the oxide semiconductor TFT can operate at higher speed than an amorphous silicon TFT. In addition, the oxide semiconductor TFT has such advantages that it can be produced by the same process as that of the amorphous silicon TFT, and that it can be applied to a display device with larger screen size than a TFT utilizing polycrystalline silicon (see Patent Document No. 3, for example).

CITATION LIST

Patent Literature

Patent Document No. 1: Japanese Laid-Open Patent Publication No. 2008-170664
Patent Document No. 2: Japanese Laid-Open Patent Publication No. 2004-61687
Patent Document No. 3: Japanese Laid-Open Patent Publication No. 2003-298062

SUMMARY OF INVENTION

Technical Problem

However, such a display device provided with an oxide semiconductor TFT has not been mass-produced yet, and it is required to hurriedly establish the mass-production technique thereof.

The present invention has been conducted in view of the above-described prior art, and the object of the present invention is to provide a production method suitable for mass-producing a semiconductor device such as a display device provided with an oxide semiconductor TFT, and a semiconductor device produced by the production method.

Solution to Problem

The semiconductor device in one embodiment of the present invention is a semiconductor device including: a substrate; a thin film transistor formed on the substrate; a gate line having a first connecting portion; a source line having a second connecting portion; and first and second terminals for electrically connecting the thin film transistor to an external wiring, wherein the thin film transistor includes: an insulating film formed on the gate line; an island-like oxide semiconductor layer, formed on the insulating film, having a channel region, and a source region and a drain region positioned on both sides of the channel region, respectively; the source line electrically connected to the source region; and a drain electrode electrically connected to the drain region, the semiconductor device further includes: a passivation film, provided on the source line and the drain electrode, for covering the thin film transistor; and a pixel electrode formed on the passivation film, the pixel electrode being in contact with the drain electrode, the first terminal includes: a first gate terminal portion formed by the same conductive film as that of the gate line; and a first pixel electrode line formed on the insulating film and formed by the same conductive film as that of the pixel electrode, the first pixel electrode line being in contact with the first gate terminal portion in a first opening portion provided in the insulating film, covering an end face of the insulating film in the first opening portion, and being electrically connected to the first connecting portion, and the second terminal includes: a second gate terminal portion formed by the same conductive film as that of the gate line; and a second pixel electrode line formed on the insulating film and formed by the same conductive film as that of the pixel electrode, the second pixel electrode line being in contact with the second gate terminal portion in a second opening portion provided in the insulating film, covering an end face of the insulating film in the second opening portion, and being electrically connected to the second connecting portion.

In one embodiment, the above-described semiconductor device further includes an opening region provided in the insulating film, wherein the opening region is formed in at least one of a portion between the first terminal and the first connecting portion and a portion between the second terminal and the second connecting portion.

In one embodiment, part of the storage capacitor line is formed in at least one of a portion between the opening region and the first terminal and a portion between the opening region and the second terminal.

The semiconductor device in another embodiment of the present invention is a semiconductor device including: a substrate; a thin film transistor formed on the substrate; a gate line; a source line; a connecting portion; and first and second terminals for electrically connecting the thin film transistor to an external wiring, wherein the thin film transistor includes: an insulating film formed on the gate line; an island-like oxide semiconductor layer, formed on the insulating film, having a channel region, and a source region and a drain region positioned on both sides of the channel region, respectively; the source line electrically connected to the source region; and a drain electrode electrically connected to the drain region, the semiconductor device further includes: a passivation film, provided on the source line and the drain electrode, for covering the thin film transistor; and a pixel electrode formed on the passivation film, the pixel electrode being in contact with the drain electrode, the first terminal includes: a gate terminal portion formed in part of the gate line; and a first pixel electrode line which is in contact with the gate terminal portion in a first opening portion provided in the insulating film and the passivation film, and is formed by the same conductive film as that of the pixel electrode, the first pixel electrode line covering end faces of the insulating film and the passivation film in the first opening portion, the connecting portion includes: a source terminal connecting line formed by the same conductive film as that of the gate line; the insulating film formed on the source terminal connecting line; the source line and the passivation film formed on the insulating film; and a second pixel electrode line formed on the passivation film and formed by the same conductive film as that of the pixel electrode, the second pixel electrode line being electrically connected to the source terminal connecting line and the source line in a second opening portion provided in the insulating film and the passivation film, and the second terminal includes: the source terminal connecting line; and a third pixel electrode line formed on the source terminal connecting line and the insulating film and formed by the same conductive film as that of the pixel electrode, the third pixel electrode line being in contact with the source terminal connecting line in a third opening portion provided in the insulating film, and covering an end face of the insulating film in the third opening portion, and the source terminal connecting line electrically connecting the second terminal to the connecting portion.

In one embodiment, in the above-described semiconductor device, in an end face of the passivation film positioned between the connecting portion and the second terminal, a recessed portion is formed on the side of the second terminal and in part of an end face of the insulating film.

In one embodiment, the height of the recessed portion is equal to the thickness of the oxide semiconductor layer.

The production method of a semiconductor device in one embodiment of the present invention is a production method of the above-described semiconductor device including the steps of: (A) forming a conductive film for a gate line on a substrate and patterning it, thereby forming a gate line and first and second gate terminal portions; (B) forming an insulating film on the gate line and the first and second gate terminal portions; (C) forming an oxide semiconductor layer on the insulating film and on respective peripheries of the first and second gate terminal portions; (D) forming a source line on the insulating film; (E) forming a passivation film for covering an area except for a terminal area including the first and second gate terminal portions; (F) performing etching of the insulating film by using the oxide semiconductor layer as a mask, thereby forming a first opening portion for exposing the surface of the first gate terminal portion and a second opening portion for exposing the surface of the second gate terminal portion in the insulating film on the first and second gate terminal portions, respectively, and performing etching of the insulating film and the passivation film, thereby forming a third opening portion in the insulating film and the passivation film on the gate line, and performing etching the passivation film, thereby forming a fourth opening portion in the passivation film on the source line; (G) removing the oxide semiconductor layer by etching; and (H) forming, on the insulating film, a first pixel electrode line electrically connected to the first gate terminal portion in the first opening portion and electrically connected to the gate line in the third opening portion, and forming, on the insulating film, a second pixel electrode line electrically connected to the second gate terminal portion in the second opening portion and electrically connected to the source line in the fourth opening portion.

In one embodiment, the step (A) includes the step of patterning the conductive film for a gate line, thereby forming part of a storage capacitor line in at least one of a portion between the first gate terminal portion and the gate line and a portion on the side of the gate line of the second gate terminal portion.

In one embodiment, the step (F) includes the step of forming an opening region in the insulating film in at least one of a portion between the gate line and the first gate terminal portion and a portion between the source line and the second gate terminal portion.

In one embodiment, the step (G) includes the step of removing the oxide semiconductor layer in the terminal area by wet etching.

In one embodiment, the step (H) includes the step of forming the first pixel electrode line so as to cover the end face of the insulating film in the first opening portion, and forming the second pixel electrode line so as to cover the end face of the insulating film in the second opening portion.

The production method of a semiconductor device in another embodiment of the present invention is a production method of the above-described semiconductor device including the steps of: (A) forming a conductive film for a gate line on a substrate and patterning it, thereby forming a gate line and a source terminal connecting line; (B) forming an insulating film on the gate line and the source terminal connecting line; (C) forming an oxide semiconductor layer on the source terminal connecting line and on the insulating film; (D) forming a source line on the insulating film; (E) forming a passivation film for covering the gate line and the source line; (F) performing etching of the insulating film by using the oxide semiconductor layer as a mask, thereby forming a first opening portion for exposing the surface of the source terminal connecting line in the insulating film on the source terminal connecting line; (G) removing the oxide semiconductor layer on the source terminal connecting line by etching; and (H) forming, on the insulating film, a first pixel electrode line which is in contact with the source terminal connecting line in the first opening portion, thereby electrically connecting the source terminal connecting line to the source line.

In one embodiment, the production method includes the step of forming the first pixel electrode line so as to cover an end face of the insulating film in the first opening portion.

In one embodiment, the step (F) includes the step of forming a second opening portion in the passivation film on the source line and in the passivation film and the insulating film on the first source terminal connecting line, and the step (H) includes the step of forming, on the passivation film, a second pixel electrode line for electrically connecting the source line to the source terminal connecting line in the second opening portion.

In one embodiment, the step (G) includes the step of forming a recessed portion on the side of the first opening portion and in a portion on the side of the insulating film of the end face of the passivation film on the source terminal connecting line, by removing the oxide semiconductor layer on the source terminal connecting line by wet etching.

Advantageous Effects of Invention

According to the present invention, a production method suitable for mass-producing a semiconductor device such as a display device provided with an oxide semiconductor TFT, and a semiconductor device produced by the production method are provided. Especially, in a TFT substrate provided with a TFT and a terminal for connecting an electrode of the TFT to an external wiring, it is possible to increase the reliability of the TFT substrate.

DESCRIPTION OF EMBODIMENTS

Figure 1:
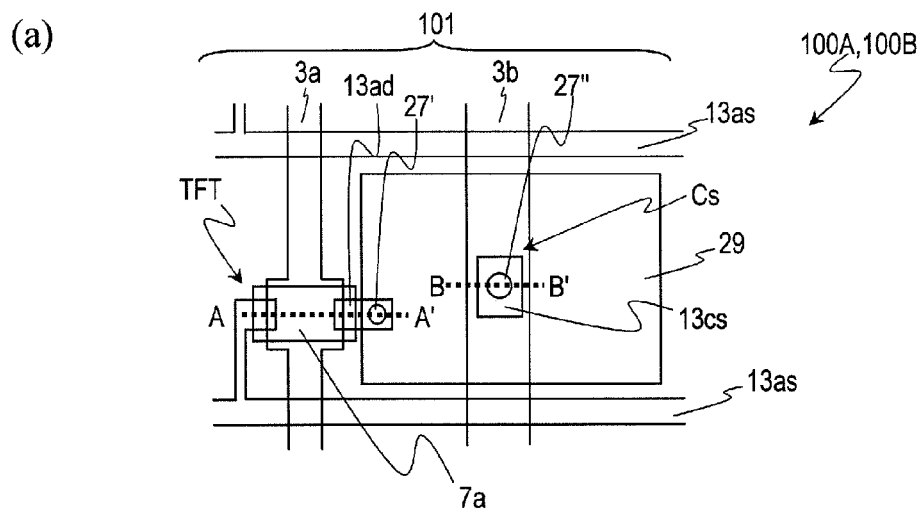
In FIG. 1, (a) is a schematic plan view of a display area of TFT substrates 100A and 100B in one embodiment of the present invention, (b) is a schematic plan view for explaining a gate terminal of the TFT substrate 100A, and (c) is a schematic plan view for explaining a source terminal of the TFT substrate 100A.
Figure 1:
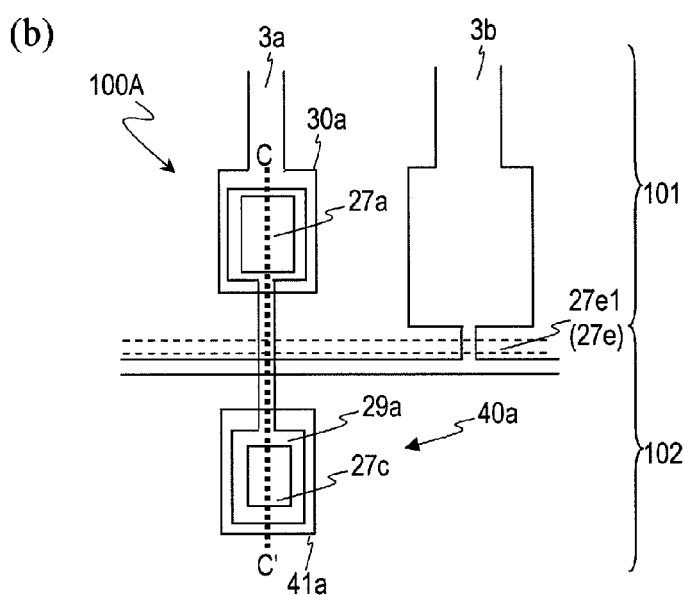
Figure 1:
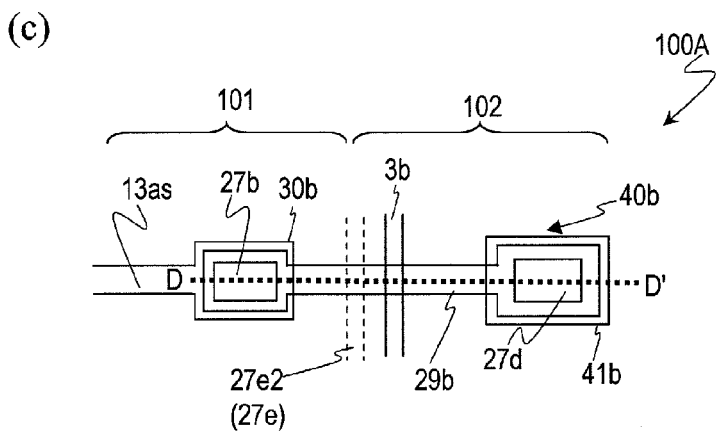

The inventors of the present invention obtained knowledge that an oxide semiconductor layer can be selectively removed more easily than an amorphous silicon layer, and conceived a production method of a semiconductor device including the step of removing an insulating film for covering a conductive layer of a terminal portion by using the oxide semiconductor layer as an etching mask.

Hereinafter with reference to the drawings, a production method of a semiconductor device in one embodiment of the present invention and the configuration of a semiconductor device (herein a TFT substrate) produced by the production method will be described. As for the TFT substrate in this embodiment, it is sufficient that at least one oxide semiconductor TFT be formed. The TFT substrate in this embodiment may include a TFT substrate used in various types of display devices.

Herein, TFT substrates 100A and 100B of a liquid crystal display device each provided with an oxide semiconductor TFT as a switching device and the production method thereof will be exemplarily described. The TFT substrates 100A and 100B have a display area 101 including a plurality of pixel portions, and a terminal area 102 positioned substantially in an outer edge portion of the TFT substrates 100A and 100B. In this embodiment, an oxide semiconductor TFT and a storage capacitor Cs are formed in each pixel portion of the display area 101, and a first terminal (e.g., a gate terminal) and a second terminal (e.g., a source terminal) are formed in the terminal area 102.

FIG. 1(a) to FIG. 1(c) are schematic plan views for explaining the TFT substrate 100A in this embodiment. FIG. 2(a) is a schematic sectional view taken along a line A-A' in FIG. 1(a), FIG. 2(b) is a schematic sectional view taken along a line B-B' in FIG. 1(a), FIG. 2(c) is a schematic sectional view taken along a line C-C' in FIG. 1(b), and FIG. 2(d) is a schematic sectional view taken along a line D-D' in FIG. 1(c). In the TFT substrate, common components are designated by the same reference numerals.

First, as shown in FIG. 1, the TFT substrate 100A includes a TFT, a gate line 3a having a first connecting portion 30a, a source line 13as having a second connecting portion 30b, a storage capacitor line 3b, a first terminal 40a, and a second terminal 40b.

As shown in FIG. 1(a) and FIG. 2(a), the TFT includes a gate line 3a, an insulating film (a gate insulating film) 5 formed on the gate line 3a, an oxide semiconductor layer 7a formed on the insulating film 5, and a source line 13as and a drain electrode 13ad formed on the oxide semiconductor layer 7a. A passivation film 25 is formed on the oxide semiconductor layer 7a, the source line 13as, and the drain electrode 13ad. In this embodiment, the passivation film 25 is constituted by a passivation film 25a as a lower layer and a passivation film 25b as an upper layer. An opening portion 27' is formed in the passivation film 25. The drain electrode 13ad of the TFT is electrically connected to a pixel electrode 29 formed on the passivation film 25 in the opening portion 27'.

As show in FIG. 1(a) and FIG. 2(b), a storage capacitor Cs includes a storage capacitor line 3b, an insulating film 5 formed on the storage capacitor line 3b, and a storage capacitor electrode 13cs formed on the insulating film 5. In addition, a passivation film 25 is formed on the storage capacitor electrode 13cs. In the passivation film 25 on the storage capacitor electrode 13cs, an opening portion 27" is formed. The storage capacitor electrode 13cs of the storage capacitor Cs is electrically connected to the pixel electrode 29 in the opening portion 27".

As shown in FIG. 1(b) and FIG. 2(c), the first connecting portion 30a is formed in part of the gate line 3a, and is electrically connected to a first pixel electrode line 29a formed by the same conductive film as that of the pixel electrode 29 in the opening portion 27a provided in the insulating film 5 and the passivation film 25. The first pixel electrode line 29a is formed on the passivation film 25, and covers end faces of the insulating film 5 and the passivation film 25 in the opening portion 27a. In addition, the first pixel electrode line 29a electrically connects the first connecting portion 30a and a first terminal 40a which will be described later.

The first terminal 40a has a first gate terminal portion 41a formed by the same conductive film as that of the gate line 3a, and a first pixel electrode line 29a formed on the insulating film 5 and formed by the same conductive film as that of the pixel electrode 29. The first pixel electrode line 29a is in contact with the first gate terminal portion 41a in an opening portion 27c provided in the insulating film 5, and covers the end face of the insulating film 5 in the opening portion 27c. The first terminal 40a is a terminal for electrically connecting an external wiring to the TFT substrate 100A.

As shown in FIG. 1(c) and FIG. 2(d), a second connecting portion 30b is formed in part of the source line 13as, and is electrically connected to a second pixel electrode line 29b formed by the same conductive film as that of the pixel electrode 29 in an opening portion 27b provided in the passivation film 25. The second pixel electrode line 29b is formed on the passivation film 25, and covers the end face of the passivation film 25 in the opening portion 27b. In addition, the second pixel electrode line 29b electrically connects the second connecting portion 30b to a second terminal 40b which will be described later.

The second terminal 40b has a second gate terminal portion 41b formed by the same conductive film as that of the gate line 3a, and a second pixel electrode line 29b formed on the insulating film 5 and formed by the same conductive film as that of the pixel electrode 29. The second pixel electrode line 29b is in contact with the second gate terminal portion 41b in an opening portion 27d provided in the insulating film 5, and covers the end face of the insulating film 5 in the opening portion 27d. The second terminal 40b is a terminal for electrically connecting an external wiring to the TFT substrate 100A.

As shown in FIG. 1(b), FIG. 1(c), FIG. 2(c), and FIG. 2(d), the TFT substrate 100A further includes an opening region 27e provided in the insulating film 5. The opening region 27e is formed between the first terminal 40a and the first connecting portion 30a, and between the second terminal 40b and the second connecting portion 30b. When viewed in the normal direction of the TFT substrate 100A, the first opening region 27e1 positioned between the first terminal 40a and the first connecting portion 30a extends in a row direction, and the second opening region 27e2 positioned between the second terminal 40b and the second connecting portion 30b extends in a column direction. As for the first and second opening regions 27e1 and 27e2, only either one of them may be formed, or alternatively neither of them may be formed.

Figure 2:
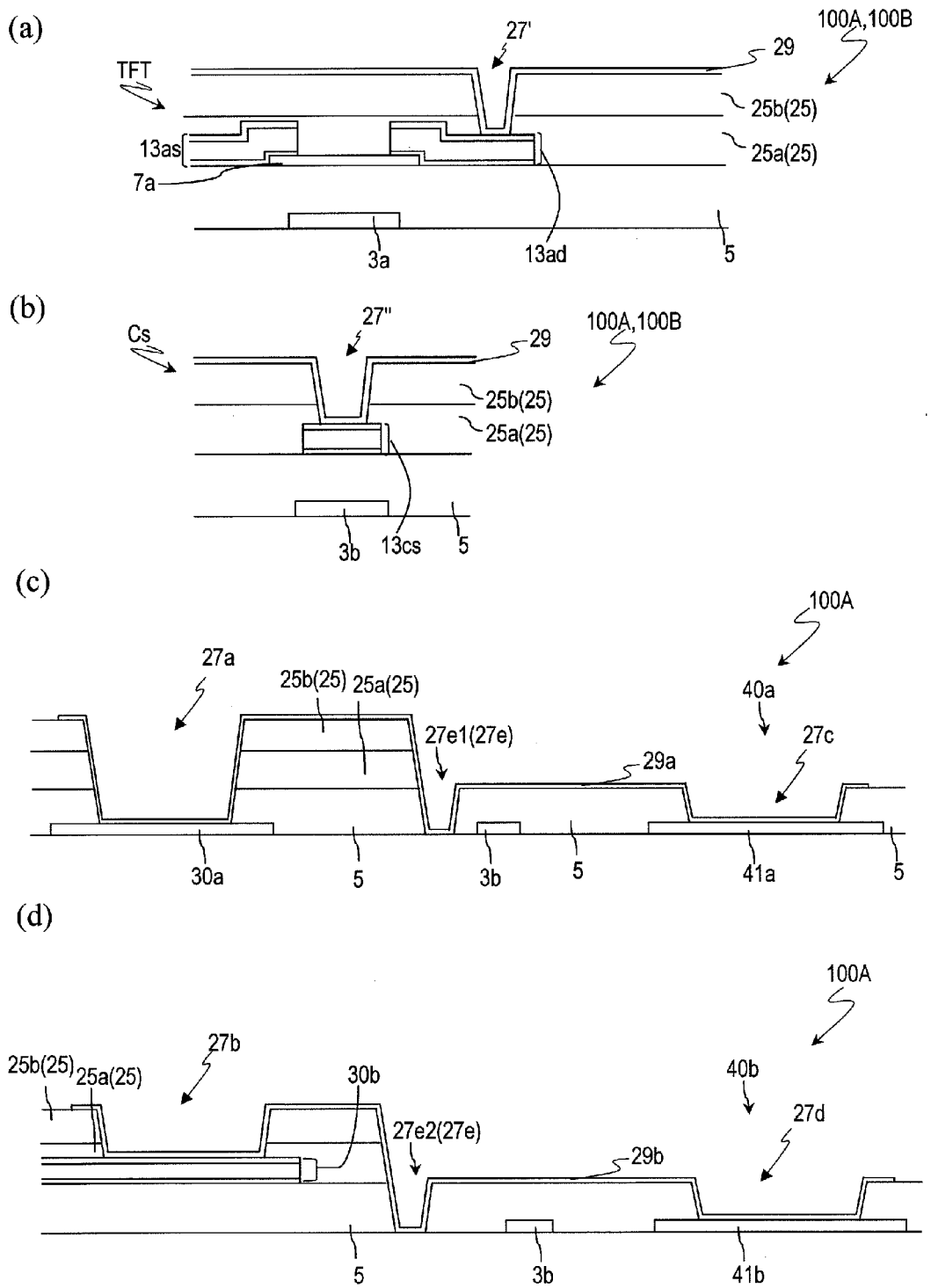
In FIG. 2, (a) is a schematic sectional view taken along a line A-A' in FIG. 1(a), (b) is a schematic sectional view taken along a line B-B' in FIG. 1(a), (c) is a schematic sectional view taken along a line C-C' in FIG. 1(b), and (d) is a schematic sectional view taken along a line D-D' in FIG. 1(c).

In addition, part of the storage capacitor line 3b is formed in a portion between the first opening region 27e1 and the first terminal 40a, and in a portion between the second opening region 27e2 and the second terminal 40b. The part of storage capacitor line 3b may be formed only in either one of them, or alternatively may be formed in neither of them. In FIG. 1 and FIG. 2, for simplicity, in the display area 101, one pixel electrode 29, one storage capacitor Cs, and one TFT are shown. However, a TFT substrate generally includes a plurality of pixel portions, and in each of the plurality of pixel portions, a pixel electrode 29, a storage capacitor Cs, and a TFT are disposed. In the terminal area 102, terminals 40a and 40b of which the numbers are the same as those of the source lines 13as and the gate lines 3a are formed. In the following description, the same is applied to the TFT substrate 100B.

Figure 3:
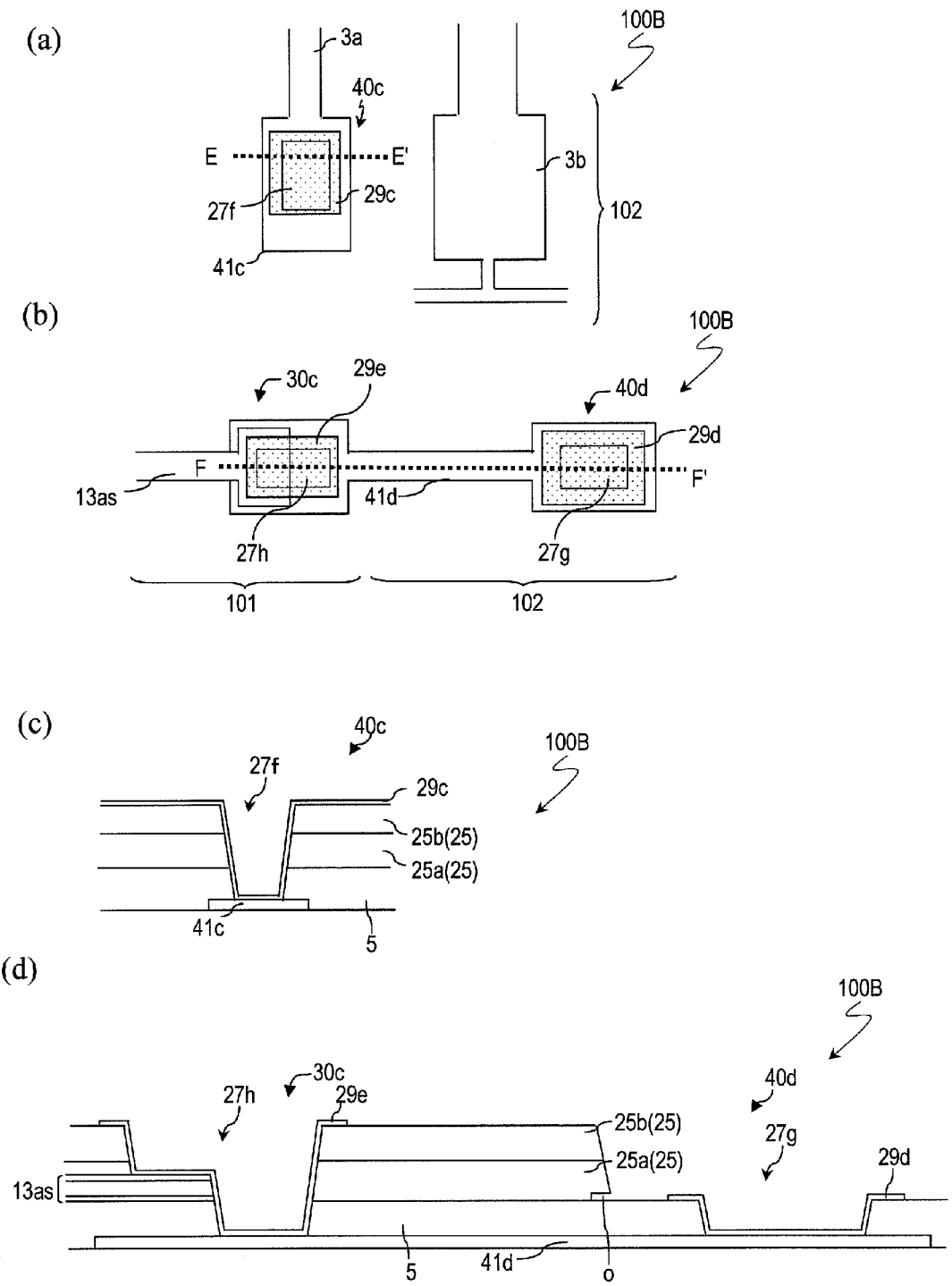
In FIG. 3, (a) is a schematic plan view for explaining a gate terminal of the TFT substrate 100B, (b) is a schematic plan view for explaining a source terminal of the TFT substrate 100B, (c) is a schematic sectional view taken along a line E-E' in (a), and (d) is a schematic sectional view taken along a line F-F' in (b).

Next, a TFT substrate 100B in another embodiment will be described with reference to FIG. 1(a), FIG. 2(a), FIG. 2(b), and FIG. 3. FIG. 3(a) is a schematic plan view for explaining a gate terminal of the TFT substrate 100B, FIG. 3(b) is a schematic plan view for explaining a source terminal of the TFT substrate 100B, FIG. 3(c) is a schematic sectional view taken along a line E-E' in FIG. 3(a), and FIG. 3(d) is a schematic sectional view taken along a line F-F' in FIG. 3(b).

As shown in FIG. 1(a), FIG. 2(a), FIG. 2(b), and FIG. 3, the TFT substrate 100B includes a TFT, a gate line 3a, a source line 13as, a storage capacitor line 3b, a connecting portion 30c, a first terminal 40c, and a second terminal 40d.

As shown in FIG. 1(a) and FIG. 2(a), the TFT included in the TFT substrate 100B has the same configuration as that of the TFT in the TFT substrate 100A.

As shown in FIG. 1(a) and FIG. 2(b), the storage capacitor Cs included in the TFT substrate 100B has the same configuration as that of the storage capacitor Cs in the TFT substrate 100A.

As shown in FIG. 3(a) and FIG. 3(c), the first terminal (e.g. a gate terminal) 40c has a gate terminal portion 41c formed in part of the gate line 3a, and a pixel electrode line 29c formed by the same conductive film as that of the pixel electrode 29. The pixel electrode line 29c is in contact with the gate terminal portion 41c in an opening portion 27f provided in the insulating film 5 and the passivation film 25, and covers the end faces of the insulating film 5 and the passivation film 25 in the opening portion 27f. The first terminal 40c is a terminal for electrically connecting an external wiring to the TFT substrate 100B.

As shown in FIG. 3(b) and FIG. 3(d), the second terminal (e.g. a source terminal) 40d has a source terminal connecting line 41d, and a pixel electrode line 29d formed by the same conductive film as that of the pixel electrode 29. The pixel electrode line 29d is in contact with the source terminal connecting line 41d in an opening portion 27g provided in the insulating film 5, and covers the end face of the insulating film 5 in the opening portion 27g. The second terminal 40d is a terminal for electrically connecting an external wiring to the TFT substrate 100B.

The connecting portion 30c includes the source terminal connecting line 41d, the insulating film 5 formed on the source terminal connecting line 41d, the source line 13as formed on the insulating film 5, the passivation film 25 formed on the source line 13as, and a pixel electrode line 29e formed by the same conductive film as that of the pixel electrode 29. The pixel electrode line 29e is in contact with the source terminal connecting line 41d and the source line 13as in an opening portion 27h provided in the insulating film 5, the source line 13as, and the passivation film 25, and covers end faces of the insulating film 5, the source line 13as, and the passivation film 25 in the opening portion 27h. In addition, the connecting portion 30c is electrically connected to the above-mentioned second terminal 40d by the source terminal connecting line 41d.

In addition, in part of the end face of the passivation film 25 on the source terminal connecting line 41d, on the side of the second terminal 40d and on the side of the insulating film 5, a recessed portion o is formed. The height of the recessed portion o is equal to the thickness of the oxide semiconductor layer 7a shown in FIG. 2(a). The height of the recessed portion o is, for example, 30 nm or more and 300 nm or less.

The gate line 3a, the storage capacitor line 3b, the first gate terminal portion 41a, the second gate terminal portion 41b, the gate terminal portion 41c, and the source terminal connecting line 41d have a layered structure formed from, for example, TiN (titanium nitride)/Ti (titanium)/Al (aluminum) (Al is the undermost layer). The thicknesses of the gate line 3a, the storage capacitor line 3b, the first gate terminal portion 41a, the second gate terminal portion 41b, the gate terminal portion 41c, and the source terminal connecting line 41d are 150 nm or more and 600 nm or less, for example. The source line 13as, the drain electrode 13ad, and the storage capacitor electrode 13cs have a layered structure formed from MoN (molybdenum nitride)/Al/MoN. The thicknesses of the source line 13as, the drain electrode 13ad, and the storage capacitor electrode 13cs are 150 nm or more and 600 nm or less, for example. The gate line 3a, the storage capacitor line 3b, the first gate terminal portion 41a, the second gate terminal portion 41b, the gate terminal portion 41c, the source terminal connecting line 41d, the source line 13as, the drain electrode 13ad, and the storage capacitor electrode 13cs can be formed, for example, by using W (tungsten), Ti, Ta (tantalum), or Mo which are high melting point metals, or their alloy materials, or any one of nitride materials, or Cu (copper) or Al. Moreover, the gate line 3a, the storage capacitor line 3b, the first gate terminal portion 41a, the second gate terminal portion 41b, the gate terminal portion 41c, the source terminal connecting line 41d, the source line 13as, the drain electrode 13ad, and the storage capacitor electrode 13cs may have a single-layer structure.

The insulating film 5 is formed from an $SiO_2$ film having a thickness of about 400 nm, for example. The insulating film 5 may be a single layer of an $SiO_2$ film, for example, or may have a layered structure having an SiNx film as a lower layer and an $SiO_2$ film as an upper layer. In the case of the single layer of $SiO_2$ film, it is preferred that the thickness of the $SiO_2$ film be 300 nm or more and 500 nm or less. In the case of the layered structure constituted by the SiNx film (the lower layer) and the $SiO_2$ film (the upper layer), it is preferred that the thickness of the SiNx film be 200 nm or more and 500 nm or less, and the thickness of the $SiO_2$ film be 20 nm or more and 150 nm or less.

The oxide semiconductor layer 7a is formed from an In—Ga—Zn—O semiconductor (IGZO) film having a thickness of 30 nm or more and 300 nm or less, for example. Instead of the IGZO film, an oxide semiconductor layer may be formed by using another oxide semiconductor film.

The passivation film 25 has a layered structure constituted by an $SiO_2$ film having a thickness of about 150 nm as a lower layer 25a and a photosensitive organic insulating film having a thickness of about 1000 nm or more and 4000 nm or less as an upper layer 25b. Alternatively, the lower layer 25a and the upper layer 25b of the passivation film 25 may be formed from an $SiO_2$ film or an SiNx film, for example. Moreover, the passivation film 25 may have a single-layer structure formed from an $SiO_2$ film or an SiNx film, for example.

The pixel electrode 29 and the pixel electrode lines 29a to 29e are formed from a transparent conductive film such as an ITO (Indium Tin Oxide) film, for example.

As for the terminals respectively included in the TFT substrates 100A and 100B, the pixel electrode lines included in the respective terminals do not cause disconnection, and the end face of the insulating film in the opening portion of the terminal is covered with the pixel electrode line, so that the adhesion of TAB for connecting the external wiring to the terminal is high. As a result, the TFT substrate has high reliability, and it is possible to attain stable display quality of a liquid crystal display device having such a TFT substrate.

Next, the production method of the TFT substrates 100A and 100B will be described. The common components in the TFT substrates are designated by the same reference numerals, and duplicate explanations are omitted.

Figure 4:
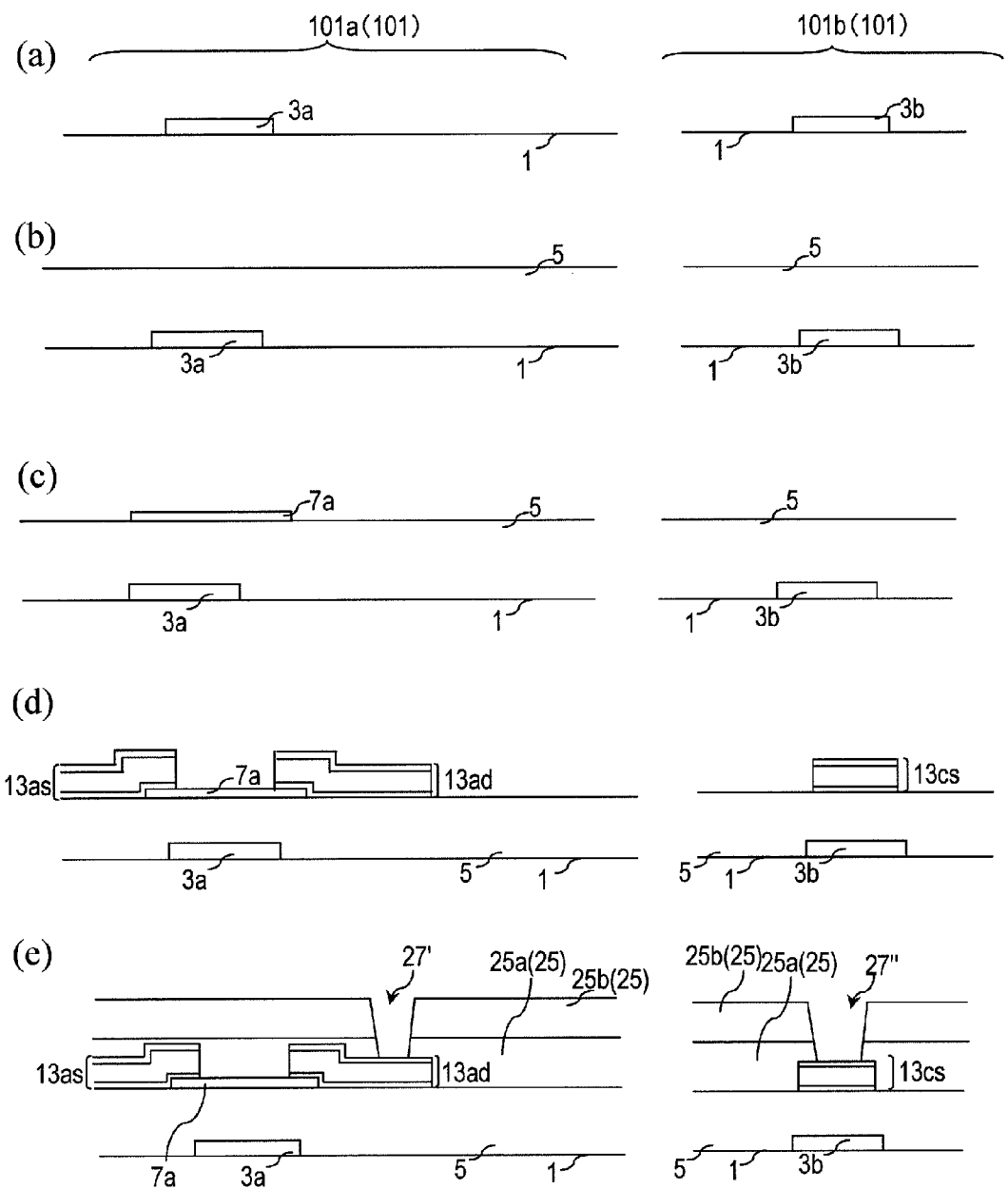
In FIG. 4, (a) to (e) are schematic sectional views for explaining production processes of a TFT and a storage capacitor of the TFT substrates 100A and 100B.
Figure 5:
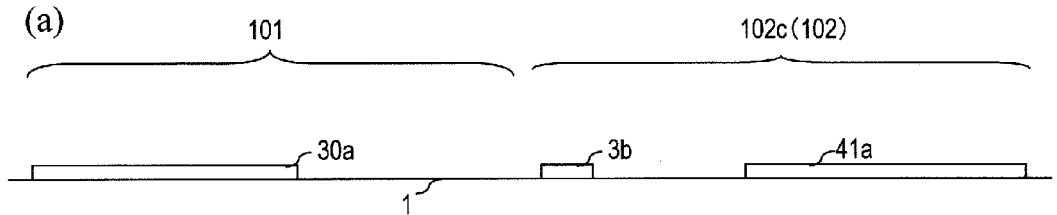
In FIG. 5, (a) to (e) are schematic sectional views for explaining a production process of the gate terminal of the TFT substrate 100A.
Figure 5:
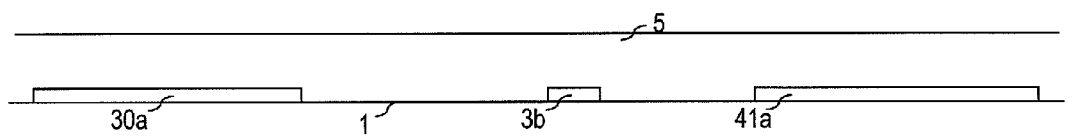
Figure 5:
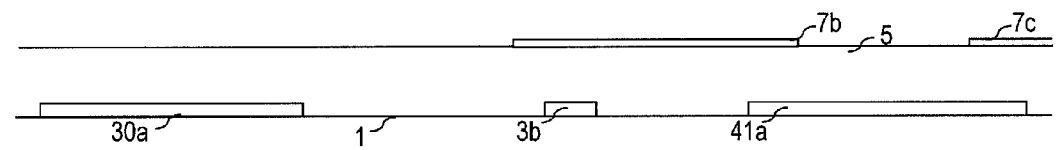
Figure 5:
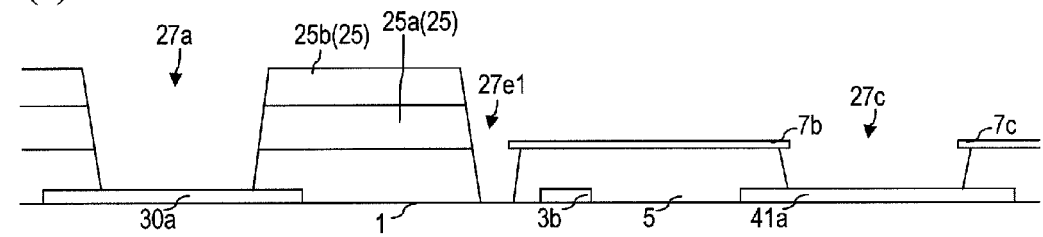
Figure 5:
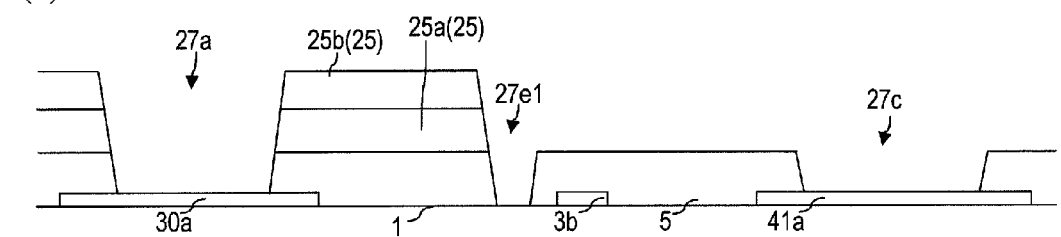
Figure 6:
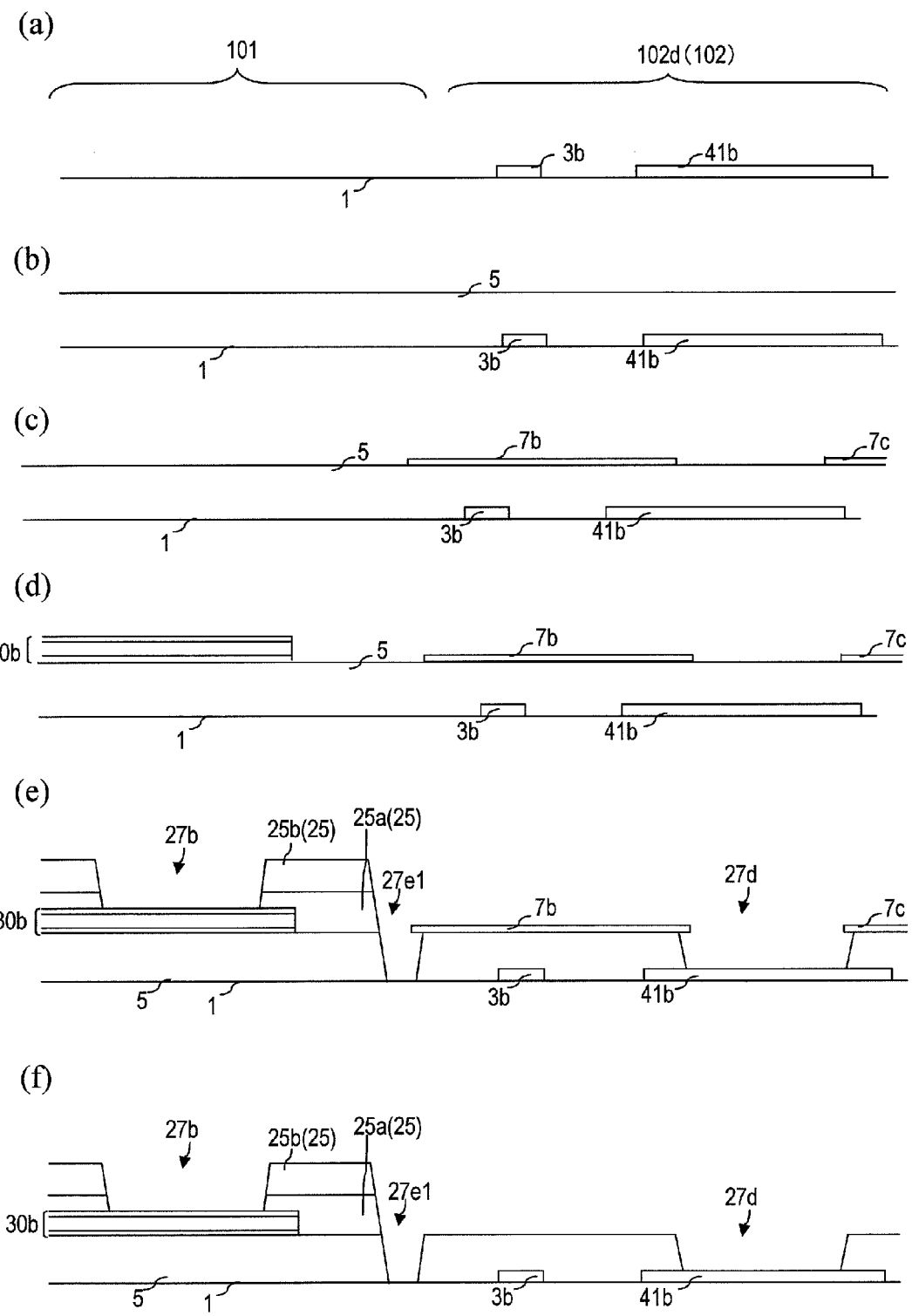
In FIG. 6, (a) to (f) are schematic sectional views for explaining a production process of the source terminal of the TFT substrate 100A.

With reference to FIG. 4 to FIG. 6, the production method of the TFT substrate 100A will be described. FIG. 4(a) to FIG. 4(e) are schematic sectional views for explaining the production processes of the TFT and the storage capacitor of the TFT substrates 100A and 100B. FIG. 5(a) to FIG. 5(e) are schematic sectional views for explaining the production process of the gate terminal of the TFT substrate 100A. FIG. 6(a) to FIG. 6(f) are schematic sectional view for explaining the production process of the source terminal of the TFT substrate 100A.

As shown in FIG. 4(a), FIG. 5(a), and FIG. 6(a), a conductive film for a gate line is formed on a substrate 1, and then patterned, thereby forming a gate line 3a in an area in which a TFT is to be formed (a TFT forming area) 101a, a storage capacitor line 3b in an area in which a storage capacitor Cs is to be formed (a storage capacitor forming area) 101b, a first gate terminal portion 41a in an area in which a gate terminal is to be formed (a gate terminal forming area) 102c, and a second gate terminal portion 41b in an area in which a source terminal is to be formed (a source terminal forming area) 102d in the substrate 1. The TFT forming area 101a and the storage capacitor forming area 101b are positioned in each pixel portion in the display area 101. The gate terminal forming area 102c is positioned in a region extending in the row direction in the terminal area 102 positioned in a peripheral portion of the substrate, for example. The source terminal forming area 102d is positioned in a region extending in the column direction in the terminal area 102 positioned in the peripheral portion of the substrate, for example. The gate line 3a is extended to the vicinity of the gate terminal forming area 102c. In the gate line 3a, a first connecting portion 30a is formed in the vicinity of the gate terminal forming are 102c. Moreover, in the vicinity of the gate terminal forming area 102c and in the vicinity of the source terminal forming area 102d, part of the storage capacitor line 3b is formed. Part of the storage capacitor line 13b may sometimes be formed in either of them, or alternatively formed in neither of them.

The gate line 3a, the storage capacitor line 3b, and the first and second gate terminal portions 41a and 41b are formed by patterning a metal film (e.g. a TiN/Al/Ti film), after the metal film is formed on the substrate 1 so as to have a thickness of 150 nm or more and 600 nm or less, for example, by sputtering. In the patterning of the metal film, a resist mask is formed by known photolithography, and a portion which is not covered with the resist mask is removed by dry etching (RIE: Reactive Ion Etching) with a chlorine-based gas. Thereafter, the resist mask is peeled off from the substrate 1.

Next, as shown in FIG. 4(b), FIG. 5(b), and FIG. 6(b), an insulating film (a gate insulating film) 5 is formed so as to cover the gate line 3a, the storage capacitor line 3b, and the first and second gate terminal portions 41a and 41b. In this embodiment, as the insulating film 5, an $SiO_2$ film having a thickness of about 400 nm is formed by CVD, for example.

Then, as shown in FIG. 4(c), FIG. 5(c), and FIG. 6(c), on the insulating film 5, an island-like oxide semiconductor layer 7a which will function as a channel layer of the TFT is formed in the TFT forming area 101a, and island-like oxide semiconductor layers 7b and 7c are formed in the gate and source terminal forming areas 102c and 102d, respectively. The island-like oxide semiconductor layers 7b and 7c in the gate terminal forming area 102c are formed on the periphery of the first gate terminal portion 41a. The island-like oxide semiconductor layers 7b and 7c in the source terminal forming area 102d are formed on the periphery of the second gate terminal portion 41b.

The oxide semiconductor layers 7a, 7b, and 7c are formed in the following manner. First, an In—Ga—Zn—O semiconductor (IGZO) film having a thickness of 30 nm or more and 300 nm or less, for example, is formed by sputtering on the insulating film 5. Thereafter, by photolithography, a resist mask which covers a predetermined region of the IGZO film is formed. Then, in the IGZO film, a portion which is not covered with the resist mask is removed by wet etching. Thereafter, the resist mask is peeled off. In this way, the island-like oxide semiconductor layers 7a, 7b, and 7c are obtained. Alternatively, instead of the IGZO film, the oxide semiconductor layers 7a, 7b, and 7c may be formed by using any other oxide semiconductor film.

Next, a conductive film is formed over an entire surface of the substrate 1. In this embodiment, for example, a metal film such as an MoN/Al/Ti film having a thickness of 150 nm or more and 600 nm or less, for example, is formed by sputtering. Thereafter, patterning of the metal film is performed by photolithography, for example. In the patterning, the MoN/Al is etched by utilizing phosphoric acid/acetic acid/nitric acid. Thereafter, Ti is etched by dry etching (RIE) utilizing a chlorine-based gas. In this way, as shown in FIG. 4(d) and FIG. 6(d), in the TFT forming area 101a, a source line 13as and a drain electrode 13ad are formed so as to be respectively in contact with regions positioned on both sides of a region which will be a channel region in the oxide semiconductor layer 7a on the insulating film 5. In the storage capacitor forming area 101b, a storage capacitor electrode 13cs is formed on the insulating film 5. The source line 13as is extended to the vicinity of the source terminal forming area 102d. A second connecting portion 30b is formed in part of the source line in the vicinity thereof.

In this way, the oxide semiconductor TFT is formed in the TFT forming area 101a, and the storage capacitor Cs is formed in the storage capacitor forming area 102b.

Next, so as to cover the TFT and the storage capacitor Cs, a passivation film 25a is deposited over the entire surface of the substrate 1. In this embodiment, as the passivation film 25a, an oxide film (thickness: about 265 nm, for example) such as an $SiO_2$ film is formed by CVD. The passivation film 25a may be a single layer of an SiO2 film, for example, or alternatively may have a layered structure having an $SiO_2$ film as a lower layer and an SiNx film as an upper layer. In the case of the single layer of $SiO_2$ film, it is preferred that the thickness of the $SiO_2$ film be 50 nm or more and 300 nm or less. In the case of the layered structure constituted by the $SiO_2$ film (the lower layer) and the SiNx film (the upper layer), it is preferred that the thickness of the $SiO_2$ film be 50 nm or more and 150 nm or less, and the thickness of the SiNx film be 50 nm or more and 200 nm or less.

Next, a passivation film 25b is formed on the passivation film 25a so as to cover a region except for the regions which will be an opening portion on the drain electrode 13ad and an opening portion on the storage capacitor electrode 13cs, and the gate and source terminal areas 102c and 102d. The passivation film 25b is formed from a photosensitive organic insulating film (thickness: about 1000 nm or more and 4000 nm or less, for example) by photolithography, for example.

Next, the passivation film 25b is used as a mask, thereby performing the patterning of the passivation film 25a of the lower layer. Accordingly, as shown in FIG. 4(e), FIG. 5(d), and FIG. 6(e), in the TFT forming area 101a, an opening portion 27' for exposing the surface of the drain electrode 13ad is formed in the passivation film 25a. In addition, in the storage capacitor forming area 101b, an opening portion 27" for exposing the surface of the storage capacitor electrode 13ad is formed in the passivation film 25a. In the gate terminal forming area 102c, the oxide semiconductor layers 7b and 7c are used as a mask, thereby forming an opening portion 27c so as to expose the surface of the first gate terminal portion 41a. Similarly, in the source terminal forming area 102d, the oxide semiconductor layers 7b and 7c are used as a mask, thereby forming an opening portion 27d so as to expose the surface of the second gate terminal portion 41b.

Herein, the etching rate of the insulating film 5 is higher than the etching rate of the oxide semiconductor layers 7b and 7c, so that in the opening portions 27c and 27d, the end face of the insulating film 5 is formed under the oxide semiconductor layers 7b and 7c. In addition, in the gate terminal forming area 102c, an opening region 27e1 is formed in a portion of the insulating film 5 between the first connecting portion 30a and the first gate terminal portion 41a which is not covered with the oxide semiconductor layer 7b. Similarly, in the source terminal forming area 102d, an opening region 27e2 is formed in a portion of the insulating film 5 between the second connecting portion 30b and the second gate terminal portion 41b which is not covered with the oxide semiconductor layer 7b.

Then, as shown in FIG. 5(e) and FIG. 6(f), the oxide semiconductor layers 7b and 7d in the gate and source terminal forming areas 102c and 102d are removed by wet etching. As for the specific conditions for the wet etching, the temperature is 30° C. or higher and 60° C. or lower, the oxalate solution having the concentration of 5% or more and 50% or less is used, and the treatment period of time is 10 seconds or more and 300 seconds or less. The oxalate solution is sprinkled by shower. If the wet etching is performed under the conditions, the insulating film 5 is not etched, and the remaining film control of the insulating film 5 can be easily performed.

If an amorphous silicon layer is used as a mask instead of the oxide semiconductor layers 7b and 7c, and then the amorphous silicon layer is removed by etching, the insulating film 5 is also etched. The etching rate of the insulating film 5 is higher than the etching rate of the amorphous silicon layer, so that it is difficult to perform the remaining film control of the insulating film 5. In other words, the above-described process in which the semiconductor layer is used as the etching mask is embodied for the first time based on the knowledge that the oxide semiconductor layer can be selectively removed more easily than the amorphous silicon layer.

Then, a transparent conductive film is formed on the passivation film 25 and in the opening portions 17b and 17c, and the patterning of the transparent conductive film is performed. In this embodiment, the transparent conductive film is deposited by sputtering, for example. As the transparent conductive film, for example, an ITO film (thickness: 50 nm or more and 200 nm or less) is used. Then, by known photolithography, the patterning of the ITO film is performed by a known method. Accordingly, as shown in FIG. 2(a) to FIG. 2(d), the pixel electrode 29 which is in contact with the drain electrode 13ad and the storage capacitor electrode 13cs, the pixel electrode line 29a which is in contact with the first connecting portion 30a and the first gate terminal portion 41a, and the pixel electrode line 29b which is in contact with the second connecting portion 30b and the second gate terminal portion 41b are formed. The pixel electrode 29 is disposed separately for each pixel. The pixel electrode lines 29a and 29b cover the end faces of the insulating film 5 and the passivation film 25 in the opening portions 27a and 27b, and the end face of the insulating film 5 in the opening portions 27c and 27d. By the pixel electrode line 29a, the first connecting portion 30a and the first gate terminal portion 41a are electrically connected. Similarly, by the pixel electrode line 29b, the second connecting portion 30b and the second gate terminal portion 41b are electrically connected. In this way, a gate terminal 40a is formed in the gate terminal forming area 102c, and a source terminal 40b is formed in the source terminal forming area 102d.

In the above-described production process of the TFT substrate 100A, the oxide semiconductor layers 7b and 7c in the terminal area 102 are removed, so that end faces of the oxide semiconductor layers 7b and 7c are not formed in the opening portions 27j and 27k shown in FIG. 2(c) and FIG. 2(d), for example, and no disconnection occurs in the pixel electrode lines 29a and 29b formed thereon. In addition, the pixel electrode lines 29a and 29b are formed so as to cover the end face of the insulating film 5 in the opening portions 27c and 27d, so that the peeling-off caused by the deterioration of adhesion of TAB for connecting the source and gate terminals 40a and 40b to the external wiring, and poor TAB crimping such as variation in crimping area do not occur, thereby increasing the reliability of the TFT substrate. As a result, the display quality of a liquid crystal display device having such a TFT substrate is stable, for example.

Figure 7:
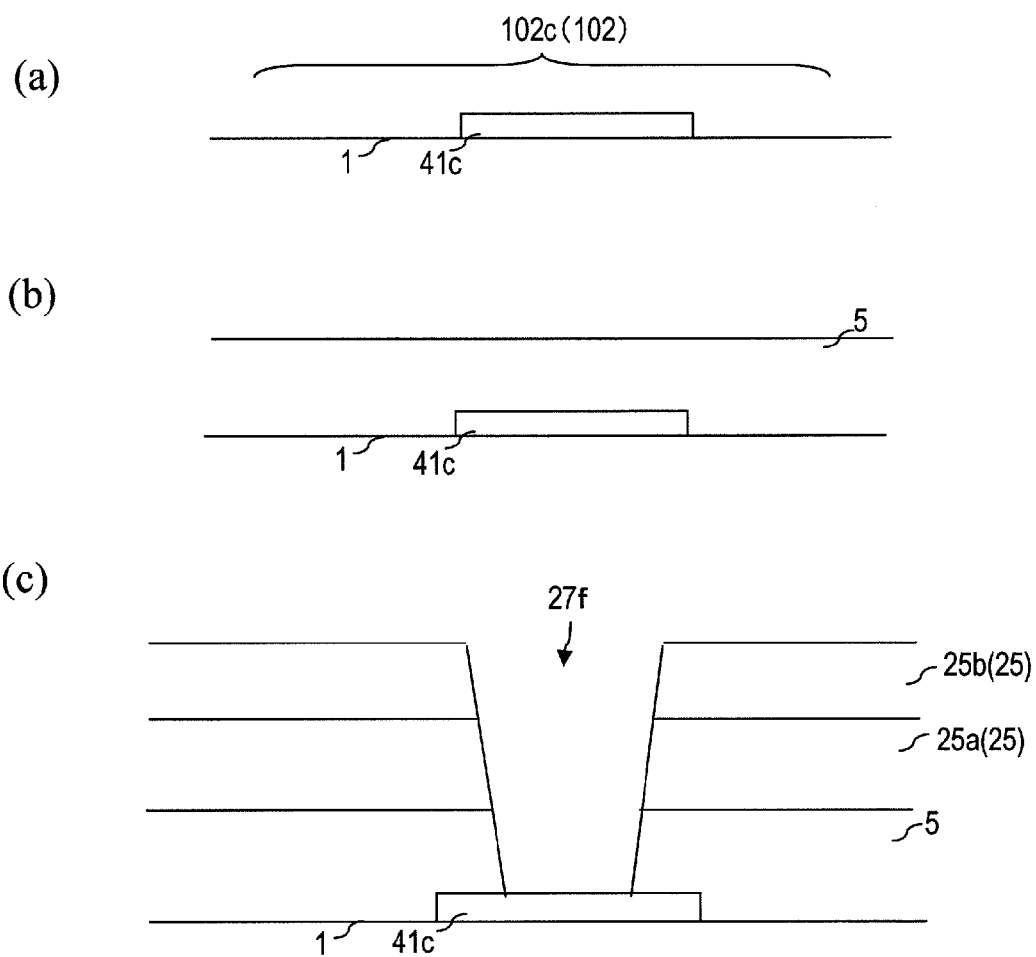
In FIG. 7, (a) to (c) are schematic sectional views for explaining a production process of the gate terminal of the TFT substrate 100B.
Figure 8:
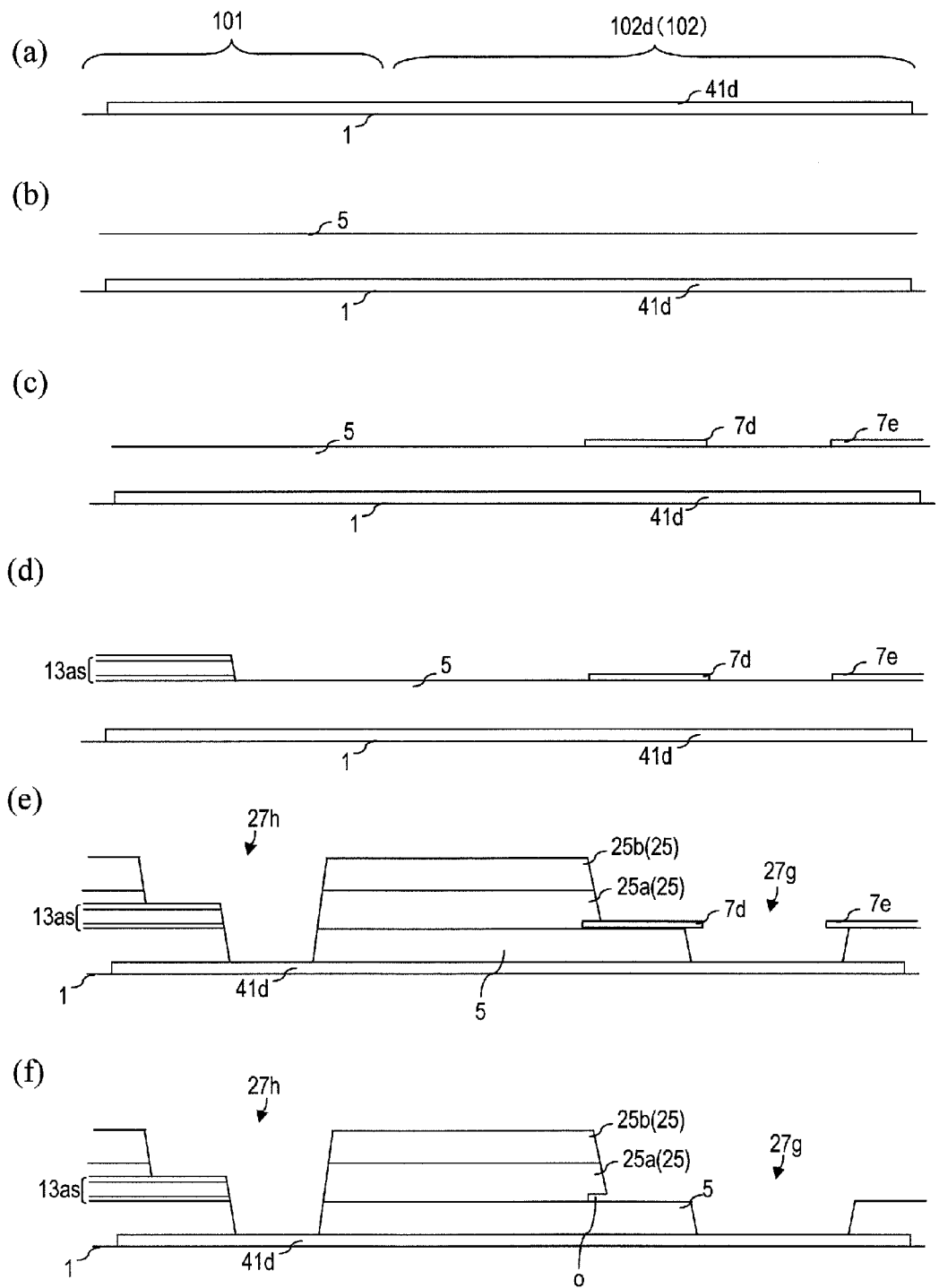
In FIG. 8, (a) to (f) are schematic sectional views for explaining a production process of the source terminal of the TFT substrate 100B.

Next, the production method of the TFT substrate 100B will be described with reference to FIG. 7 and FIG. 8. As for the TFT and the storage capacitor Cs are common to those in the TFT substrate 100A, so that the descriptions thereof are omitted, and the common components are designated by the same reference numerals. FIG. 7(a) to FIG. 7(c) are schematic sectional views for explaining the production process of the gate terminal of the TFT substrate 100B. FIG. 8(a) to FIG. 8(f) are schematic sectional views for explaining the production process of the source terminal of the TFT substrate 100B.

As shown in FIG. 7(a) and FIG. 8(a), a conductive film for a gate line having a thickness of, for example, 150 nm or more and 600 nm or less is formed on a substrate 1, and then patterned, thereby forming a gate terminal portion 41c in the gate terminal forming area 102c and a source terminal connecting line 41d in the source terminal forming area 102d in the substrate 1. The gate terminal portion 41c is formed in part of the gate line 3a (not shown) which is extended to the gate terminal forming area 102c.

The gate terminal portion 41c and the source terminal connecting line 41d are formed in such a manner that a metal film (e.g. a TiN/Al/Ti film) is formed by sputtering or other technique on the substrate 1 and then the metal film is patterned by the above-described method. Thereafter, the resist mask is peeled off from the substrate 1.

Next, as shown in FIG. 7(b) and FIG. 8(b), an insulating film (a gate insulating film) 5 is formed so as to cover the gate terminal portion 41c and the source terminal connecting line 41d. As for the insulating film 5, as described above, an $SiO_2$ film having a thickness of about 400 nm is formed by CVD, for example.

Then, as shown in FIG. 8(c), on the insulating film in the source terminal forming area 102d, island-like oxide semiconductor layers 7d and 7e having a thickness of 30 nm or more and 300 nm or less, for example, are formed. The island-like oxide semiconductor layers 7d and 7e are formed so as to function as masks when an opening portion which will be described later is formed. The oxide semiconductor layers 7d and 7e are formed by the above-described method.

As shown in FIG. 8(d), a conductive film is formed over an entire surface of the substrate 1. In this embodiment, by sputtering, for example, a metal film such as an MoN/Al/Ti film having a thickness of 150 nm or more and 600 nm or less, for example, is formed. Thereafter, by the above-described method, the metal film is patterned. As the result of the patterning, a source line 13as is formed on the insulating film 5. The source line 13as is extended to the vicinity of the source terminal forming area 102d.

Thereafter, so as to cover the TFT and the storage capacitor Cs, a passivation film 25a is deposited over the entire surface of the substrate 1. In this embodiment, as the passivation film 25a, as described above, an oxide film such as an $SiO_2$ film (thickness: about 265 nm, for example) is formed by CVD.

Next, FIG. 7(c) and FIG. 8(e) are referred to. As described above, a passivation film 25b is formed from a photosensitive organic insulating film by photolithography. In addition, by using the passivation film 25b as a mask, the insulating film 5 and the passivation film 25a are patterned. Accordingly, as shown in FIG. 7(c) and FIG. 8(e), in the gate terminal forming area 102c, an opening portion 27f is formed in the insulating film 5 and the passivation film 25 so as to expose the surface of the gate terminal portion 41c, and in the display area 101, an opening portion 27h is formed in the insulating film 5 and the passivation film 25 so as to expose the surfaces of the source line 13as and the source terminal connecting line 41d. In the source terminal forming area 102d, the oxide semiconductor layers 7d and 7e function as masks, so that an opening portion 27g is formed in the insulating film 5 so as to expose the surface of the source terminal connecting line 41d.

Then, as shown in FIG. 8(f), in the source terminal forming area 102d, the oxide semiconductor layers 7d and 7e are removed by the above-described method. By removing the oxide semiconductor layer 7d, a recessed portion o is formed in part of the end face of the passivation film 25 positioned between the opening portion 27h and the opening portion 27g, on the side of the opening portion 27g and on the side of the insulating film 5. In some cases, the recessed portion o is not formed.

Then, as shown in FIG. 3(c) and FIG. 3(d), a transparent conductive film is formed on the passivation film 25b and in the opening portions 27f, 27g, and 27h by the above-described method and then the transparent conductive film is patterned. In this embodiment, a transparent conductive film is deposited by sputtering, for example. As the transparent conductive film, an ITO film (thickness: 50 nm or more and 200 nm or less) is used, for example. Accordingly, a pixel electrode line 29c which is in contact with the surface of the gate terminal portion 41c and which covers the end faces of the insulating film 5 and the passivation film 25 in the opening portion 27f is formed. In addition, a pixel electrode line 29e which is in contact with the surface of the source terminal connecting line 41d and the surface of the source line 13as and which covers the end faces of the insulating film 5, the source line 13as, and the passivation film 25 in the opening portion 27h is formed. Moreover, a pixel electrode line 29d which is in contact with the surface of the source terminal connecting line 41d and which covers the end face of the insulating film 5 in the opening portion 27g is formed. In this way, the connecting portion 30c, the gate terminal 40c, and the source terminal 40d are formed. The connecting portion 30c and the source terminal 40d are electrically connected by the source terminal connecting line 41d.

Similarly to the TFT substrate 100A, in the TFT substrate 100B, disconnection of the pixel electrode lines 29c and 29d does not occur, and since the end face of the insulating film 5 in the opening portion is covered with the pixel electrode line, poor crimping of TAB does not occur, so that high reliability of the TFT substrate can be attained.

Figure 9:
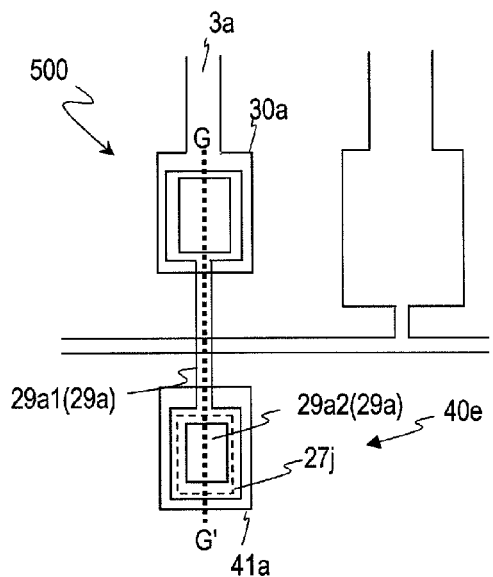
In FIG. 9, (a) is a schematic plan view for explaining a gate terminal of a TFT substrate 500 in a comparative example 1, (b) is a schematic plan view for explaining a source terminal of the TFT substrate 500, (c) is a schematic sectional view taken along a line G-G' in (a), and (d) is a schematic sectional view taken along a line H-H' in (b).
Figure 9:
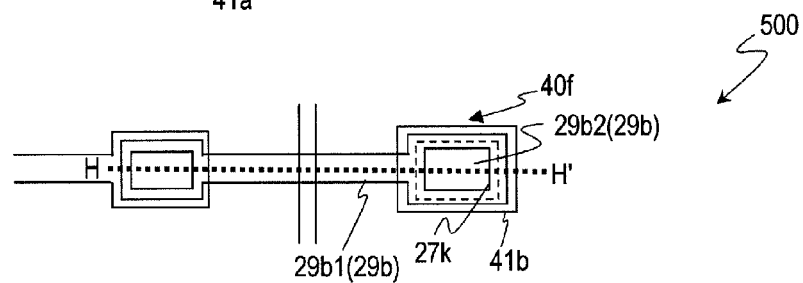
Figure 9:
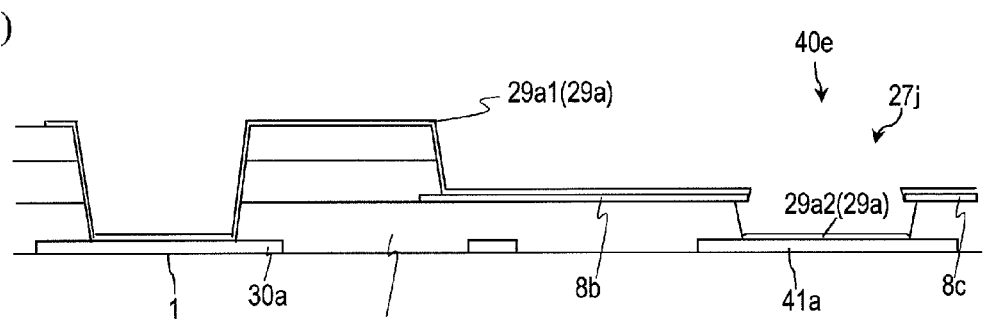
Figure 9:
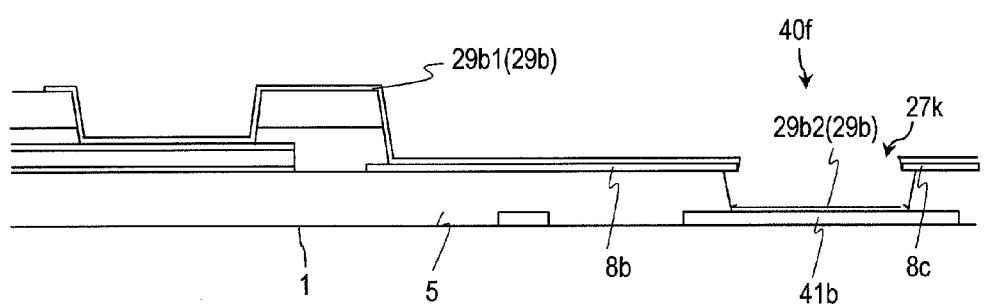
Figure 10:
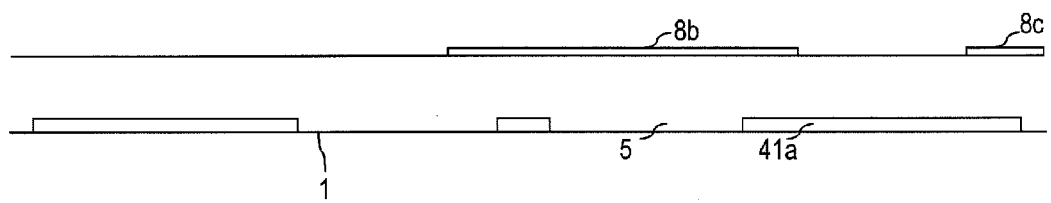
In FIG. 10, (a) and (b) are schematic sectional views for explaining a production process of the gate terminal of the TFT substrate 500.
Figure 10:
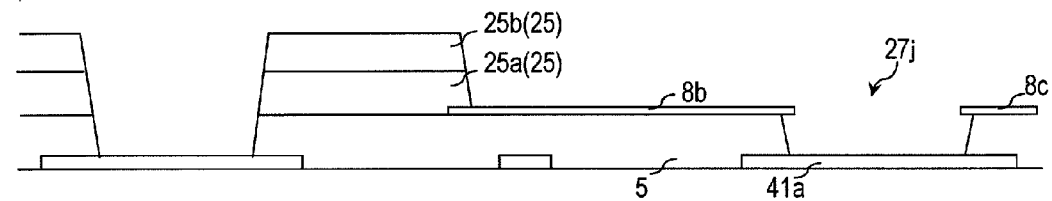
Figure 11:
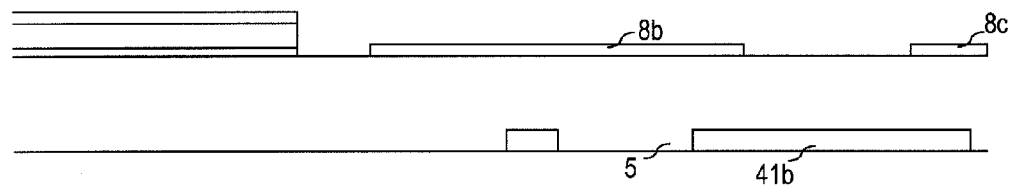
In FIG. 11, (a) and (b) are schematic sectional views for explaining a production process of the source terminal of the TFT substrate 500.
Figure 11:
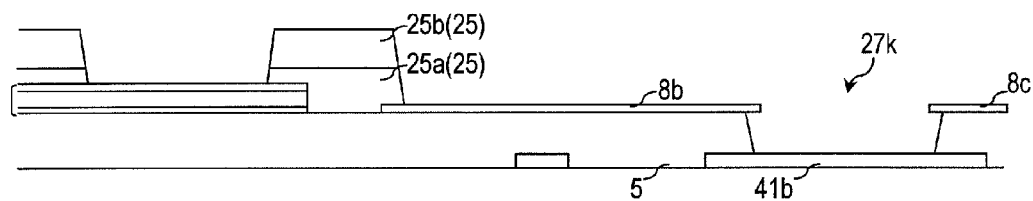

Hereinafter, as compared with TFT substrates in comparative examples 1 to 3, the advantages of the TFT substrates 100A and 100B in this embodiment will be described. First, with reference to FIG. 9 to FIG. 11, a TFT substrate 500 in the comparative example 1 and the production method thereof will be described. For the simplicity, the descriptions of the TFT and the storage capacitor Cs are omitted. In addition, the common components are designated by the same reference numerals. FIG. 9(a) is a schematic plan view for explaining a gate terminal of the TFT substrate 500 in the comparative example 1, FIG. 9(b) is a schematic plan view for explaining a source terminal of the TFT substrate 500, FIG. 9(c) is a schematic sectional view taken along a line G-G' in FIG. 9(a), and FIG. 9(d) is a schematic sectional view taken along a line H-H' in FIG. 9(b). FIG. 10(a) and FIG. 10(b) are schematic sectional views for explaining the production process of the gate terminal of the TFT substrate 500. FIG. 11(a) and FIG. 11(b) are schematic sectional views for explaining the production process of the source terminal of the TFT substrate 500.

In the TFT substrate 500 in the comparative example 1 shown in FIG. 9, oxide semiconductor layers 8b and 8c are formed on an insulating film 5 on the periphery of a first gate terminal portion 41a, and oxide semiconductor 8b and 8c are formed on the insulating film 5 on the periphery of a second gate terminal portion 41b. A pixel electrode line 29a1 on the oxide semiconductor 8b and 8c is not directly in contact with a pixel electrode line 29a2 on the first gate terminal portion 41a. An end face of the insulating film 5 in an opening portion 27j is exposed. Similarly, a pixel electrode line 29b1 on the oxide semiconductor 8b and 8c is not directly in contact with a pixel electrode line 29b2 on the second gate terminal portion 41b. An end face of the insulating film 5 in an opening portion 27k is exposed. In addition, in the opening portions 27j and 27k, the end faces of the insulating film 5 are formed under the oxide semiconductor layers 8b and 8c, so that the pixel electrode lines 29a and 29b are disconnected. As a result, in the TFT substrate 500, the peeling-off caused by the deterioration in adhesion of TAB for connecting the gate and source terminals 40e and 40f to external wirings and poor TAB crimping such as the variation in crimping areas easily occur.

Next, the production method of the TFT substrate 500 will be simply described.

First, FIG. 10(a) and FIG. 11(a) are referred to. Up to the step of forming the insulating film 5, the production method is the same as described above in the production method of the TFT substrate 100A. As shown in FIG. 10(a) and FIG. 11(a), oxide semiconductor layers 8b and 8c are formed on the insulating film 5 on the periphery of the first gate terminal portion 41a, and oxide semiconductor layers 8b and 8c are formed on the insulating film 5 on the periphery of the second gate terminal portion 41b.

Next, as shown in FIG. 10(b) and FIG. 11(b), a passivation film 25 is formed on the insulating film 5 without removing the oxide semiconductor layers 8b and 8c, and opening portions 27j and 27k are formed so as to expose the surfaces of the first and second gate terminal portions 41a and 41b in the insulating film 5, respectively, by using the oxide semiconductor layers 8b and 8c as the masks. At this time, in the respective opening portions 27j and 27k, the end faces of the insulating film 5 are formed under the oxide semiconductor layers 8b and 8c.

Next, as shown in FIG. 9(c) and FIG. 9(d), the pixel electrode lines 29a1 and 29b1 are formed on the oxide semiconductor layers 8b and 8c, and the pixel electrode lines 29a2 and 29b2 are formed on the first and second gate terminal portions 41a and 41b. At this time, the end faces of the insulating film 5 are formed under the oxide semiconductor layers 8b and 8c in the respective opening portions 27j and 27k, so that the pixel electrode line 29a1 and the pixel electrode line 29a2 are formed in such a manner that they are not directly in contact with each other, and the pixel electrode line 29b1 and the pixel electrode line 29b2 are formed in such a manner that they are not directly in contact with each other. In other words, the pixel electrode line 29a1 and the pixel electrode line 29a2 are disconnected (the pixel electrode line 29b1 and the pixel electrode line 29b2 are disconnected). In addition, in the respective opening portions 27j and 27k, the end faces of the insulating film 5 are exposed.

Figure 12:
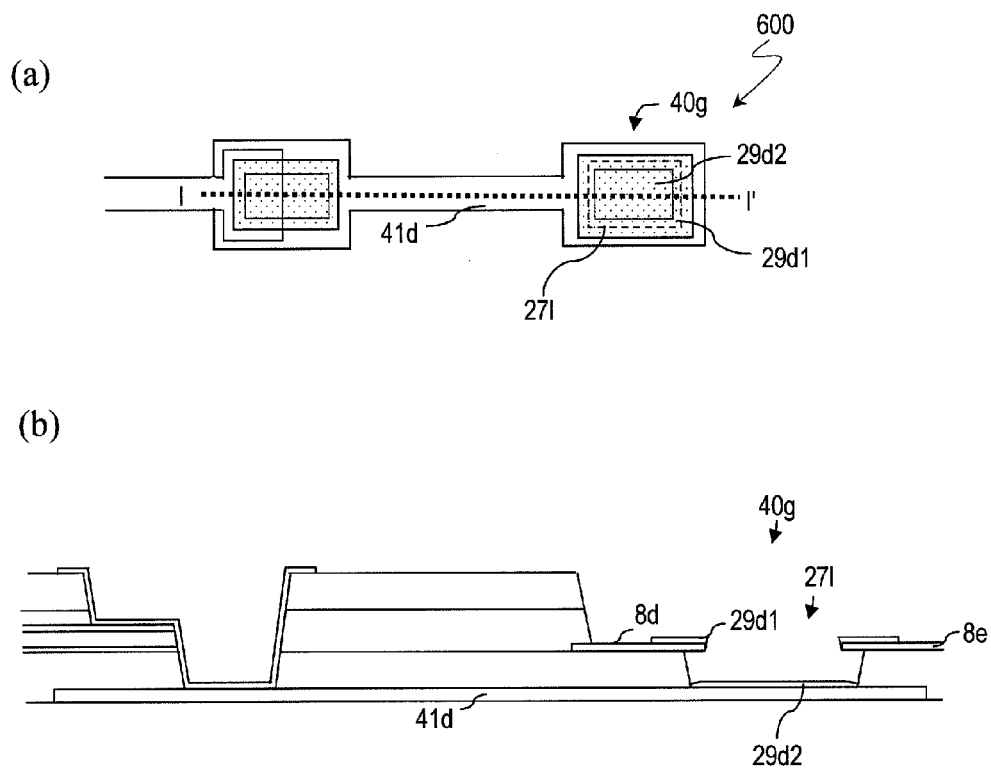
In FIG. 12, (a) is a schematic plan view for explaining a source terminal of a TFT substrate 600 in a comparative example 2, and (b) is a schematic sectional view taken along a line I-I' in (a).
Figure 13:
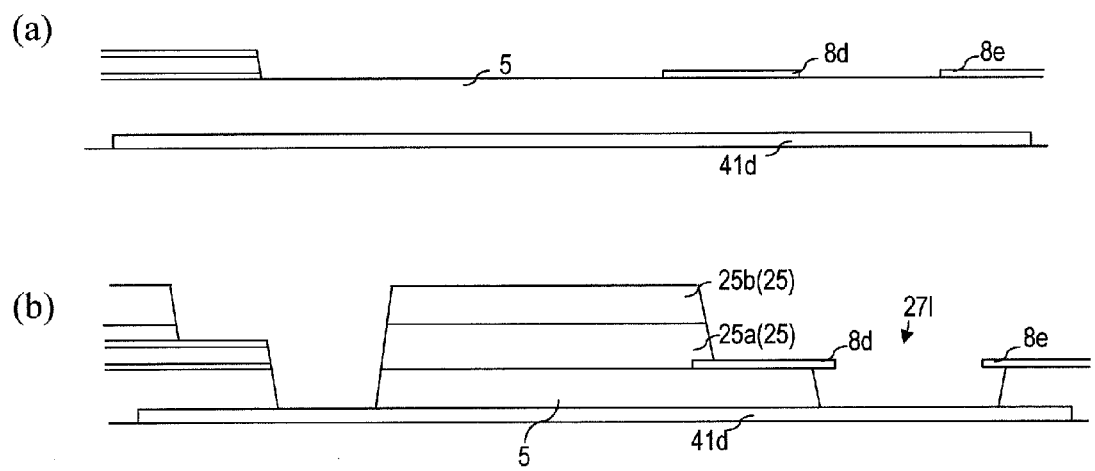
In FIG. 13, (a) and (b) are schematic sectional views for explaining a production process of the source terminal of the TFT substrate 600.

Next, with reference to FIG. 12 and FIG. 13, a TFT substrate 600 in the second comparative example 2 and the production method thereof will be described. FIG. 12(a) is a schematic plan view for explaining a source terminal of the TFT substrate 600 in the comparative example 2, and FIG. 12(b) is a schematic sectional view taken along a line I-I' in FIG. 12(a). FIG. 13(a) and FIG. 13(b) are schematic sectional views for explaining the production process of the source terminal of the TFT substrate 600. For simplicity, the descriptions of the TFT, the storage capacitor Cs, and the gate terminal are omitted.

In the TFT substrate 600 of the comparative example 2, oxide semiconductor layers 8d and 8e are formed on the insulating film 5 on the periphery of the source terminal connecting line 41d. A pixel electrode line 29d1 on the oxide semiconductor layers 8d and 8e is not directly in contact with a pixel electrode line 29d2 on the source terminal connecting line 41d. In other words, the pixel electrode line 29d1 and the pixel electrode line 29d2 are disconnected. In addition, in an opening portion 27l, the end face of the insulating film is exposed. Accordingly, similarly to the TFT substrate 500, the problem of adhesion between the source terminal 40g and the TAB arises.

Next, the production method of the TFT substrate 600 will be described simply.

First, FIG. 13(a) is referred to. Up to the step of forming the insulating film 5, the production method is the same as the production method of the TFT substrate 100B which is described above. As shown in FIG. 13(a), the oxide semiconductor layers 8d and 8e are formed on the insulating film 5 on the periphery of the source terminal connecting line 41d.

Next, as shown in FIG. 13(b), a passivation film 25 is formed on the insulating film 5 without removing the oxide semiconductor layers 8d and 8e, and an opening portion 27l is formed in the insulating film 5 by using the oxide semiconductor layers 8d and 8e as the masks so as to expose the surface of the source terminal connecting line 41d.

Next, as shown in FIG. 12(a) and FIG. 12(b), a pixel electrode line 29d1 is formed on the oxide semiconductor layers 8d and 8e, and a pixel electrode line 29d2 is formed on the source terminal connecting line 41d. At this time, in the respective opening portions 27l, the end faces of the insulating film 5 are formed under the oxide semiconductor layers 8d and 8e, so that the pixel electrode line 29d1 and the pixel electrode line 29d2 are formed in such a manner that they are not directly in contact with each other. In addition, in the opening portion 27l, the end face of the insulating film 5 is exposed.

Figure 14:
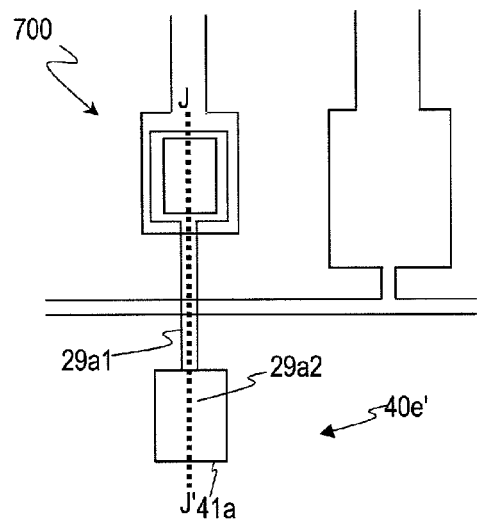
In FIG. 14, (a) is a schematic plan view for explaining a gate terminal of a TFT substrate 700 in a comparative example 3, (b) is a schematic plan view for explaining a source terminal of the TFT substrate 700, (c) is a schematic sectional view taken along a line J-J' in (a), and (d) is a schematic sectional view taken along a line K-K' in (b).
Figure 14:
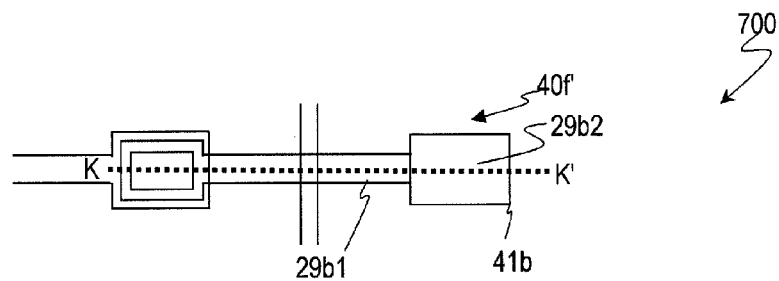
Figure 14:
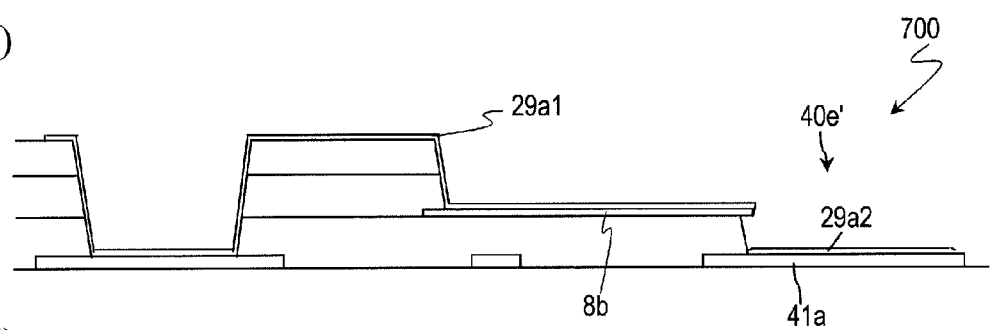
Figure 14:
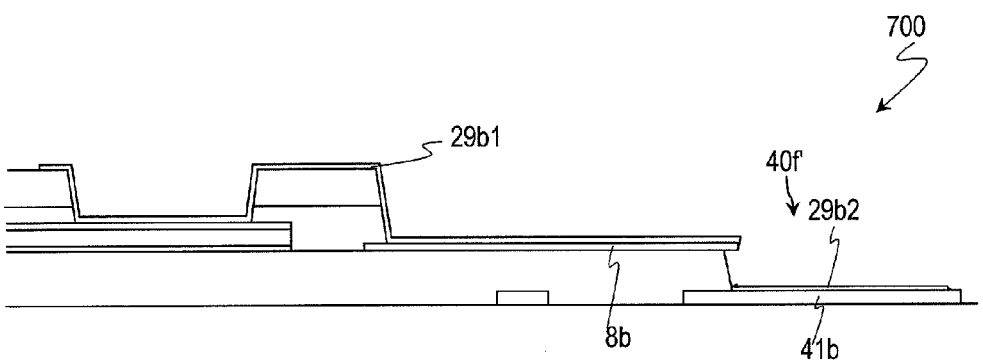
Figure 15:
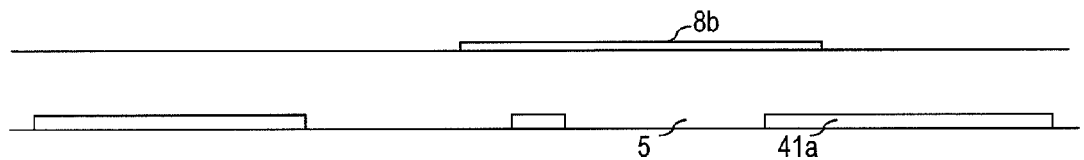
In FIG. 15, (a) and (b) are schematic sectional views for explaining a production process of the gate terminal of the TFT substrate 700.
Figure 15:
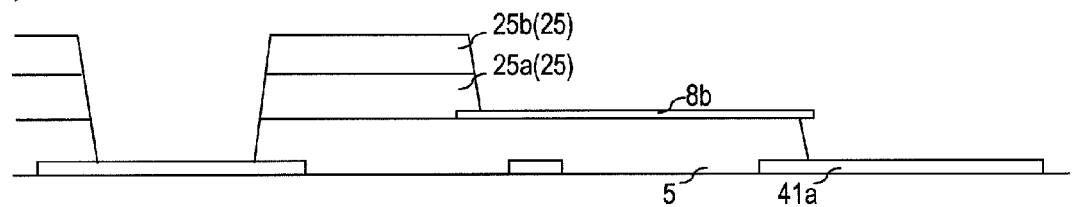
Figure 16:
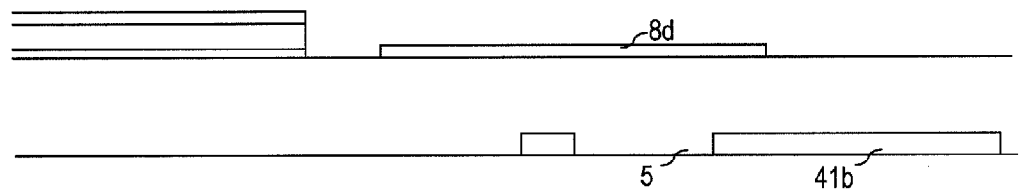
In FIG. 16, (a) and (b) are schematic sectional views for explaining a production process of the source terminal of the TFT substrate 700.
Figure 16:
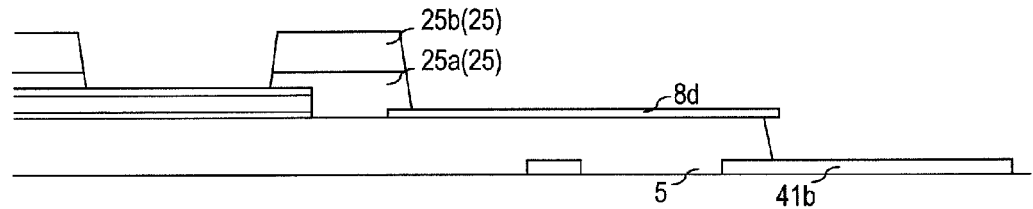
Figure 17:
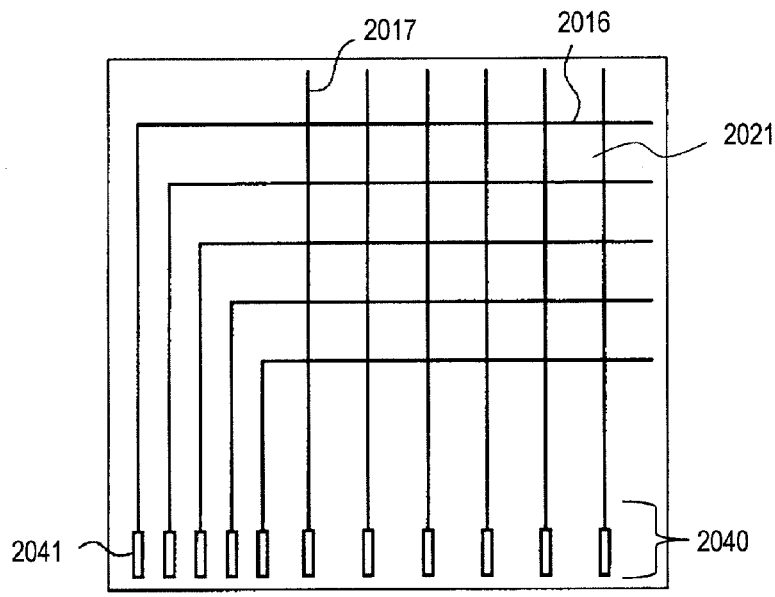
In FIG. 17, (a) is a schematic plan view generally showing a conventional TFT substrate, and (b) is an enlarged plan view showing one pixel in the TFT substrate of (a).
Figure 17:
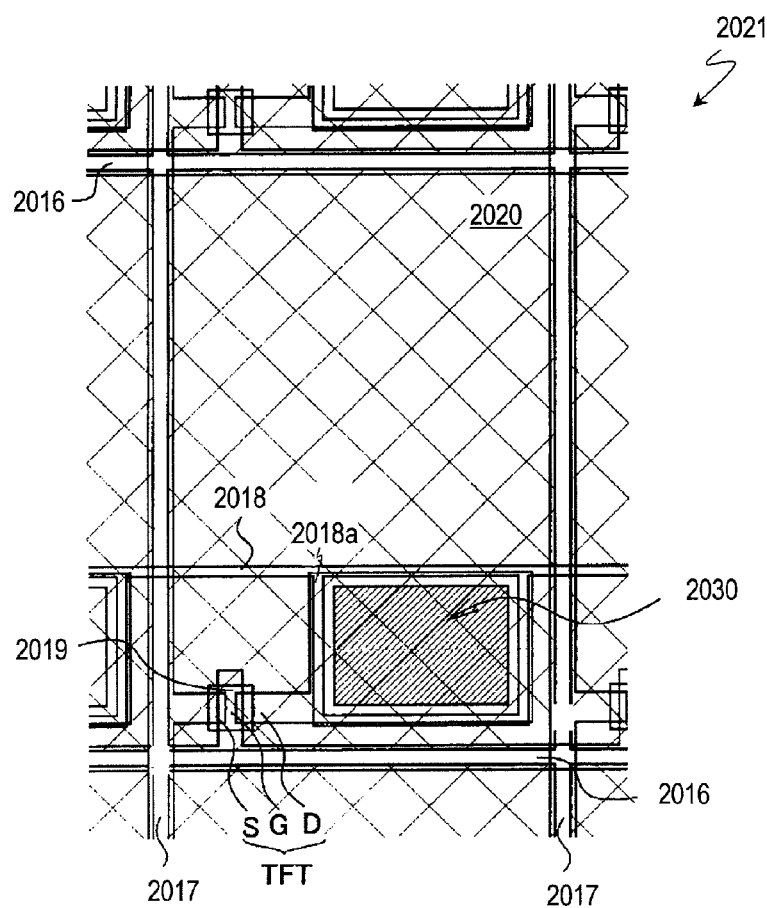
Figure 18:
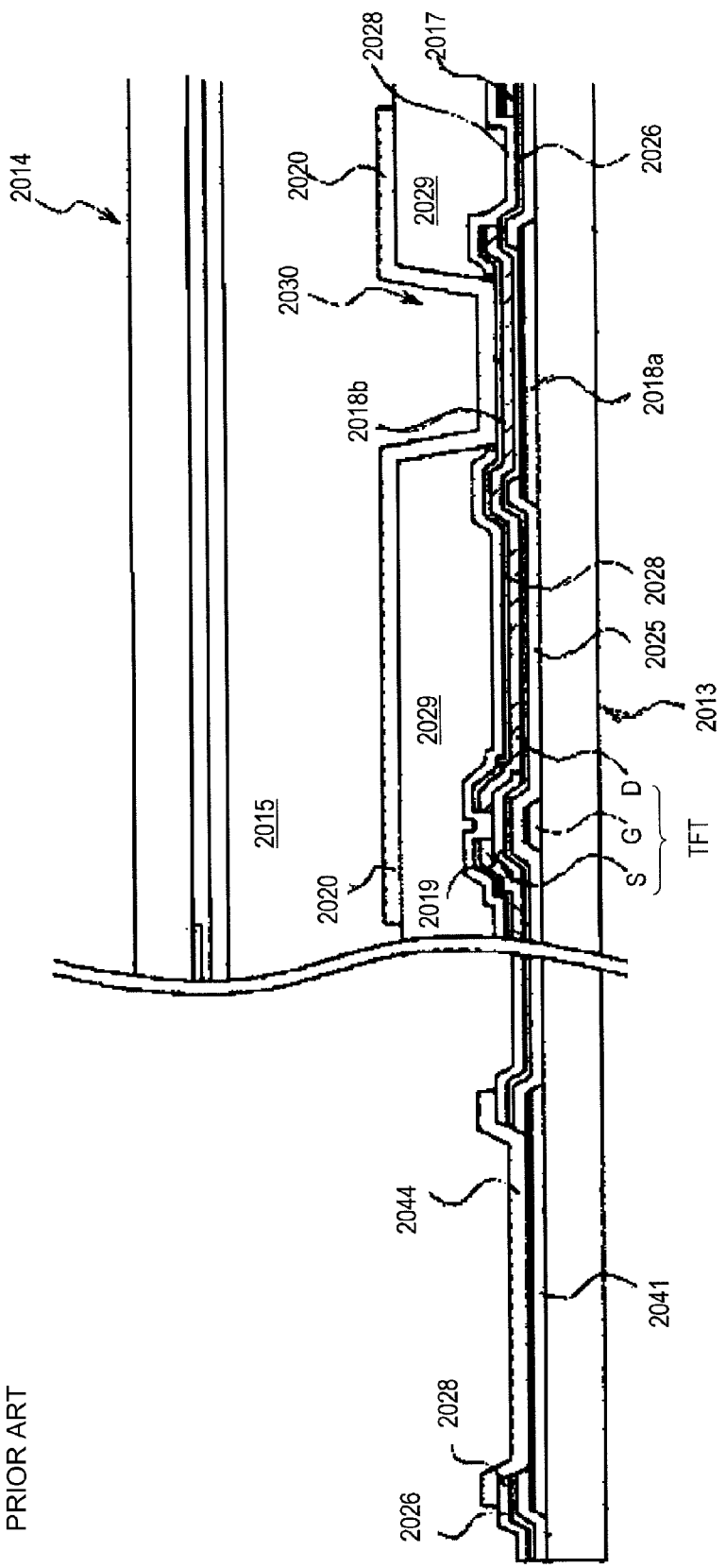
FIG. 18 is a schematic sectional view of a TFT and a terminal of the TFT substrate shown in FIG. 17.

Next, with reference to FIG. 14 to FIG. 16, a TFT substrate 700 in the comparative example 3 and the production method thereof will be described. FIG. 14(a) is a schematic plan view for explaining a gate terminal of the TFT substrate 700 in the comparative example 3, FIG. 14(b) is a schematic plan view for explaining a source terminal of the TFT substrate 700, FIG. 14(c) is a schematic sectional view taken along a line J-J' in FIG. 14(a), and FIG. 14(d) is a schematic sectional view taken along a line K-K' in FIG. 14(b). FIG. 15(a) and FIG. 15(b) are schematic sectional views for explaining the production process of the gate terminal of the TFT substrate 700. FIG. 16(a) and FIG. 16(b) are schematic sectional view for explaining the production process of a source terminal of the TFT substrate 700.

The TFT substrate 700 is a TFT substrate in which the substantially entire surfaces of the first and second gate terminal portions 41a and 41b of the TFT substrate 500 are covered with the pixel electrode lines 29a2 and 29b2. In the TFT substrate 700, similarly, the end face of the insulating film 5 on the first and second gate terminal portions 41a and 41b are formed under the oxide semiconductor layers 8b, so that the pixel electrode line 29a1 on the oxide semiconductor layer 8b is not directly in contact with the pixel electrode line 29a2 on the first gate terminal portion 41a, and also the pixel electrode line 29b1 on the oxide semiconductor layer 8b is not directly in contact with the pixel electrode line 29b2 on the second gate terminal portion 41b. In addition, the respective end faces of the insulating film 5 on the first and second gate terminal portions 41a and 41b are exposed. Accordingly, similarly to the TFT substrate 500, there arises a problem of adhesion between the gate and source terminals 41e' and 41f' and the TAB.

Next, the production method of the TFT substrate 700 will be described simply.

As shown in FIG. 15(a) and FIG. 16(a), by the same production method as that of the TFT substrate 500, the oxide semiconductor layer 8b is formed on the insulating film 5 and on the first and second gate terminal portions 41a and 41b, respectively. In the production method of the TFT substrate 700, the oxide semiconductor layer 8c shown in FIG. 10(a) and FIG. 11(a) is not formed.

next, as shown in FIG. 15(b) and FIG. 16(b), a passivation film 25 is formed, and the gate insulating film 5 is etched by using the oxide semiconductor layer 8b as a mask. As a result, the surfaces of the first and second gate terminal portions 41a and 41b are exposed.

Next, as shown in FIG. 14(c) and FIG. 14(d), pixel electrode lines 29a1 and 29b1 are formed on the oxide semiconductor layer 8b, respectively, and pixel electrode lines 29a2 and 29b2 are formed on the first and second gate terminal portions 41a and 41b, respectively. At this time, the respective end faces of the insulating film 5 on the first and second gate terminal portions 41a and 41b are formed under the oxide semiconductor layer 8b, so that the pixel electrode line 29a1 and the pixel electrode line 29a2 are not directly in contact with each other and the pixel electrode line 29b1 and the pixel electrode line 29b2 are not directly in contact with each other. In other words, the pixel electrode line 29a1 and the pixel electrode line 29a2 are disconnected (the pixel electrode line 29b1 and the pixel electrode line 29b2 are disconnected). The respective end faces of the insulating film 5 on the first and second gate terminal portions 41a and 41b are exposed.

In any of the TFT substrates 500 to 700 in the comparative examples 1 to 3, in the gate and source terminals, the end face of the insulating film 5 is formed under the oxide semiconductor layer. Moreover, the end faces of the insulating film 5 on the first and second gate terminal portions 41a and 41b in the terminals of any of the TFT substrates 500 to 700 are not covered with the pixel electrode lines. Accordingly, in the TFT substrates 500 to 700, the pixel electrode lines in the gate and source terminals are disconnected. Thus, for example, there arises a problem in adhesion of TAB for electrically connecting the external wirings to the gate and source terminals, and the reliability of the TFT substrates is low. On the other hand, the TFT substrates 100A and 100B in the above-described embodiment of the present invention do not cause such problems, and hence the reliability of the TFT substrates is high. Accordingly, the display quality of the liquid crystal display device provided with the TFT substrates 100A and 100B, for example, becomes stable.

INDUSTRIAL APPLICABILITY

The present invention can be widely applied to devices provided with a thin film transistor including a circuit substrate such as an active matrix substrate, a liquid crystal display device, a display device such as an organic electroluminescence (EL) display device and an inorganic electroluminescence display device, an image pickup device such as an image sensor device, and an electronic device such as an image input device and a fingerprint reading device. Especially, the present invention can be suitably applied to a large-screen liquid crystal display device, and the like.

REFERENCE SIGNS LIST

1 Substrate
3a Gate line
3b Storage capacitor line
5 Insulating film (gate insulating film)
7b, 7c, 7d, 7e Oxide semiconductor layers
25 Passivation film
13 as Source line
13ad Drain electrode
13cs Storage capacitor electrode
30a, 30b, 30c Connecting portions
29 Pixel electrode
101 Display area
102 Terminal area

The invention claimed is:

1. A semiconductor device comprising: a substrate; a thin film transistor formed on the substrate; a gate line having a first connecting portion; a source line having a second connecting portion; and first and second terminals for electrically connecting the thin film transistor to an external wiring, wherein
the thin film transistor includes:
an insulating film formed on the gate line;
an island-like oxide semiconductor layer, formed on the insulating film, having a channel region, and a source region and a drain region positioned on both sides of the channel region, respectively;
the source line electrically connected to the source region; and
a drain electrode electrically connected to the drain region, the semiconductor device further comprises:
a passivation film, provided on the source line and the drain electrode, for covering the thin film transistor; and
a pixel electrode formed on the passivation film, the pixel electrode being in contact with the drain electrode,
the first terminal includes:
a first gate terminal portion formed from the same conductive film as the gate line and physically separated from the first connecting portion; and
a first pixel electrode line formed on the insulating film and formed from the same conductive film as the pixel electrode,
the first pixel electrode line being in contact with the first gate terminal portion in a first opening portion provided in the insulating film, covering an end face of the insulating film in the first opening portion, and being electrically connected to the first connecting portion, and
the second terminal includes:
a second gate terminal portion formed from the same conductive film as the gate line and physically separated from the second connecting portion; and
a second pixel electrode line formed on the insulating film and formed from the same conductive film as the pixel electrode,
the second pixel electrode line being in contact with the second gate terminal portion in a second opening portion provided in the insulating film, covering an end face of the insulating film in the second opening portion, and being electrically connected to the second connecting portion.

2. The semiconductor device of claim 1, further comprising an opening region provided in the insulating film, wherein
the opening region is formed in at least one of a portion between the first terminal and the first connecting portion and a portion between the second terminal and the second connecting portion.

3. The semiconductor device of claim 2, wherein part of a storage capacitor line is formed in at least one of a portion between the opening region and the first terminal and a portion between the opening region and the second terminal.

4. A production method of the semiconductor device of claim 1, comprising the steps of:
(A) forming a conductive film for the gate line on the substrate and patterning it, thereby forming the gate line and the first and second gate terminal portions;
(B) forming the insulating film on the gate line and the first and second gate terminal portions;
(C) forming an oxide semiconductor layer on the insulating film and on respective peripheries of the first and second gate terminal portions;
(D) forming the source line on the insulating film;
(E) forming the passivation film to cover an area except for a terminal area including the first and second gate terminal portions;
(F) performing etching of the insulating film by using the oxide semiconductor layer as a mask, thereby forming the first opening portion for exposing the surface of the first gate terminal portion and the second opening portion for exposing the surface of the second gate terminal portion in the insulating film on the first and second gate terminal portions, respectively, and
performing etching of the insulating film and the passivation film, thereby forming a third opening portion in the insulating film and the passivation film on the gate line, and performing etching of the passivation film, thereby forming a fourth opening portion in the passivation film on the source line;
(G) removing the oxide semiconductor layer by etching; and
(H) forming, on the insulating film, the first pixel electrode line electrically connected to the first gate terminal portion in the first opening portion and electrically connected to the gate line in the third opening portion, and forming, on the insulating film, the second pixel electrode line electrically connected to the second gate terminal portion in the second opening portion and electrically connected to the source line in the fourth opening portion.

5. The production method of the semiconductor device of claim 4, wherein the step (A) includes the step of patterning the conductive film for the gate line, thereby forming part of a storage capacitor line in at least one of a portion between the first gate terminal portion and the gate line and a portion on a side of the gate line of the second gate terminal portion.

6. The production method of the semiconductor device of claim 4, wherein the step (F) includes the step of forming an opening region in the insulating film in at least one of a portion between the gate line and the first gate terminal portion and a portion between the source line and the second gate terminal portion.

7. The production method of the semiconductor device of claim 4, wherein the step (G) includes the step of removing the oxide semiconductor layer in the terminal area by wet etching.

8. The production method of the semiconductor device of claim 4, wherein the step (H) includes the step of forming the first pixel electrode line so as to cover the end face of the insulating film in the first opening portion, and forming the second pixel electrode line so as to cover the end face of the insulating film in the second opening portion.

9. The semiconductor device of claim 1, wherein the oxide semiconductor layer are formed of IGZO.

10. The production method of the semiconductor device of claim 4, wherein the oxide semiconductor layer are formed of IGZO.

11. A semiconductor device comprising: a substrate; a thin film transistor formed on the substrate; a gate line; a source line; a connecting portion; and first and second terminals for electrically connecting the thin film transistor to an external wiring, wherein the thin film transistor includes:
an insulating film formed on the gate line;
an island-like oxide semiconductor layer, formed on the insulating film, having a channel region, and a source region and a drain region positioned on both sides of the channel region, respectively;
the source line electrically connected to the source region; and
a drain electrode electrically connected to the drain region, the semiconductor device further comprises:
a passivation film, provided on the source line and the drain electrode, for covering the thin film transistor; and
a pixel electrode formed on the passivation film, the pixel electrode being in contact with the drain electrode,
the first terminal includes:
a gate terminal portion formed in part of the gate line; and
a first pixel electrode line which is in contact with the gate terminal portion in a first opening portion provided in the insulating film and the passivation film, and is formed from the same conductive film as the pixel electrode,
the first pixel electrode line covering end faces of the insulating film and the passivation film in the first opening portion,
the connecting portion includes:
a source terminal connecting line formed from the same conductive film as the gate line;
the insulating film formed on the source terminal connecting line;

the source line and the passivation film formed on the insulating film; and
a second pixel electrode line formed on the passivation film and formed from the same conductive film as the pixel electrode,
the second pixel electrode line being electrically connected to the source terminal connecting line and the source line in a second opening portion provided in the insulating film and the passivation film, and
the second terminal includes:
the source terminal connecting line; and
a third pixel electrode line formed on the source terminal connecting line and the insulating film and formed from the same conductive film as the pixel electrode,
the third pixel electrode line being in contact with the source terminal connecting line in a third opening portion provided in the insulating film, and covering an end face of the insulating film in the third opening portion, and
the source terminal connecting line electrically connecting the second terminal to the connecting portion.

12. The semiconductor device of claim 11, wherein, in an end face of the passivation film positioned between the connecting portion and the second terminal, a recessed portion is formed on the side of the second terminal and in part of an end face of the insulating film.

13. The semiconductor device of claim 12, wherein the height of the recessed portion is equal to the thickness of the oxide semiconductor layer.

14. A production method of the semiconductor device of claim 11, comprising the steps of:
(A) forming a conductive film for the gate line on the substrate and patterning it, thereby forming the gate line and the source terminal connecting line;
(B) forming the insulating film on the gate line and the source terminal connecting line;
(C) forming an oxide semiconductor layer on the source terminal connecting line and on the insulating film;
(D) forming the source line on the insulating film;
(E) forming the passivation film to cover the gate line and the source line;
(F) performing etching of the insulating film by using the oxide semiconductor layer as a mask, thereby forming the third opening portion for exposing the surface of the source terminal connecting line in the insulating film on the source terminal connecting line;
(G) removing the oxide semiconductor layer on the source terminal connecting line by etching; and
(H) forming, on the insulating film, the first pixel electrode line which is in contact with the source terminal connecting line in the third opening portion, thereby electrically connecting the source terminal connecting line to the source line.

15. The production method of the semiconductor device of claim 14, comprising the step of forming the first pixel electrode line so as to cover the end face of the insulating film in the third opening portion.

16. The production method of the semiconductor device of claim 14, wherein the step (F) includes the step of forming the second opening portion in the passivation film on the source line and in the passivation film and the insulating film on the source terminal connecting line, and
the step (H) includes the step of forming, on the passivation film, the second pixel electrode line for electrically connecting the source line to the source terminal connecting line in the second opening portion.

17. The production method of the semiconductor device of claim 14, wherein the step (G) includes the step of forming a recessed portion on the side of the third opening portion and in a portion on the side of the insulating film of the end face of the passivation film on the source terminal connecting line, by removing the oxide semiconductor layer on the source terminal connecting line by wet etching.

18. The semiconductor device of claim 11, wherein the oxide semiconductor layer are formed of IGZO.

19. The production method of the semiconductor device of claim 14, wherein the oxide semiconductor layer are formed of IGZO.

* * * * *